US010566308B2

(12) United States Patent
Maruyama et al.

(10) Patent No.: US 10,566,308 B2
(45) Date of Patent: Feb. 18, 2020

(54) SEMICONDUCTOR DEVICE MANUFACTURING METHOD AND SOLDERING SUPPORT JIG

(71) Applicant: FUJI ELECTRIC CO., LTD., Kawasaki-shi, Kanagawa (JP)

(72) Inventors: Rikihiro Maruyama, Matsumoto (JP); Kenshi Kai, Matsumoto (JP); Kazuya Adachi, Hino (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/019,014

(22) Filed: Jun. 26, 2018

(65) Prior Publication Data

US 2019/0057951 A1  Feb. 21, 2019

(30) Foreign Application Priority Data

Aug. 17, 2017  (JP) .................................. 2017-157692

(51) Int. Cl.
*H01L 23/00* (2006.01)
(52) U.S. Cl.
CPC .............. *H01L 24/83* (2013.01); *H01L 24/29* (2013.01); *H01L 24/32* (2013.01); *H01L 24/45* (2013.01); *H01L 24/73* (2013.01); *H01L 24/85* (2013.01); *H01L 24/92* (2013.01); *H01L 2224/0603* (2013.01); *H01L 2224/29101* (2013.01); *H01L 2224/45015* (2013.01); *H01L 2224/45124* (2013.01); *H01L 2224/45139* (2013.01); *H01L 2224/45144* (2013.01); *H01L 2224/45147* (2013.01); *H01L 2224/48139* (2013.01); *H01L 2224/48472* (2013.01); *H01L 2224/4911* (2013.01); *H01L 2224/49111* (2013.01); *H01L 2224/73265* (2013.01); *H01L 2224/83005* (2013.01); *H01L 2224/83136* (2013.01); *H01L 2224/83192* (2013.01); *H01L 2224/83203* (2013.01); *H01L 2224/83815* (2013.01); *H01L 2224/85897* (2013.01); *H01L 2224/92247* (2013.01); *H01L 2924/13055* (2013.01); *H01L 2924/13091* (2013.01); *H01L 2924/19105* (2013.01); *H01L 2924/19107* (2013.01)

(58) Field of Classification Search
CPC ....................................................... H01L 24/83
See application file for complete search history.

(56) References Cited

U.S. PATENT DOCUMENTS

2014/0317896 A1  10/2014  Maruyama et al.

FOREIGN PATENT DOCUMENTS

| JP | 2013-65662 | 4/2013 |
| JP | 2014-187179 | 10/2014 |
| JP | 2016-111255 | 6/2016 |

*Primary Examiner* — Walter H Swanson

(57) ABSTRACT

A semiconductor device manufacturing method includes: applying solder to an arrangement area of a substrate, the substrate having a connection area to which a wiring member is to be directly connected, the connection area neighboring the arrangement area; arranging a component on the arrangement area via the solder; and soldering the component to the arrangement area by heating the solder while covering the connection area. A soldering support jig includes a columnar covering member having a covering surface at a bottom of the columnar covering member.

7 Claims, 30 Drawing Sheets

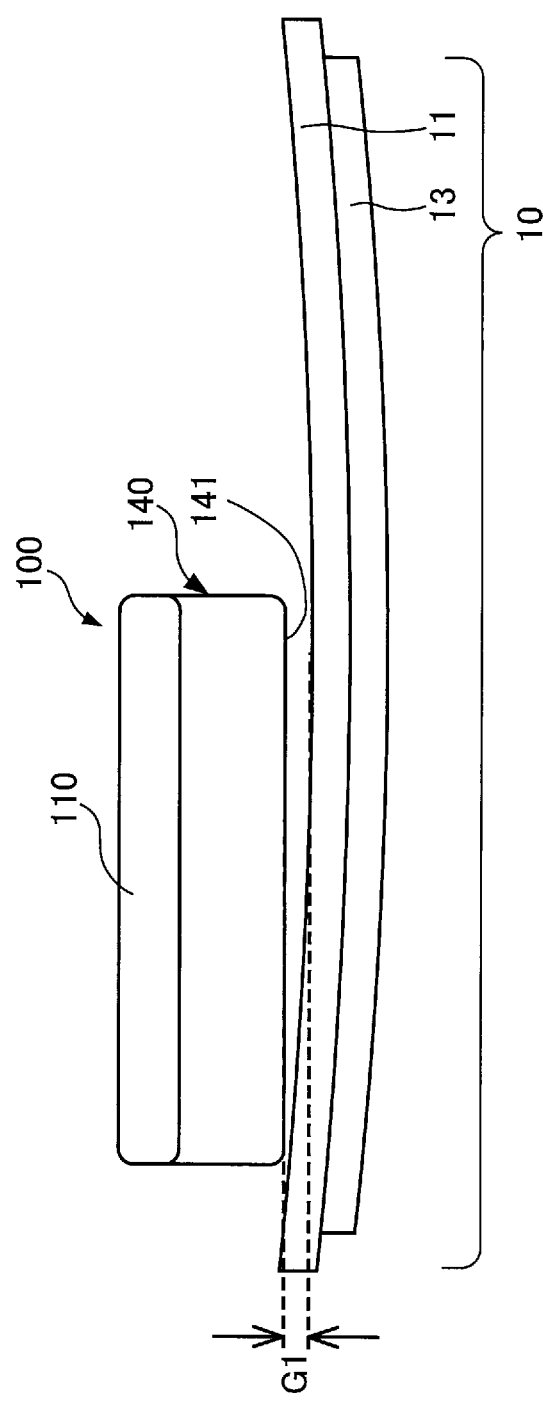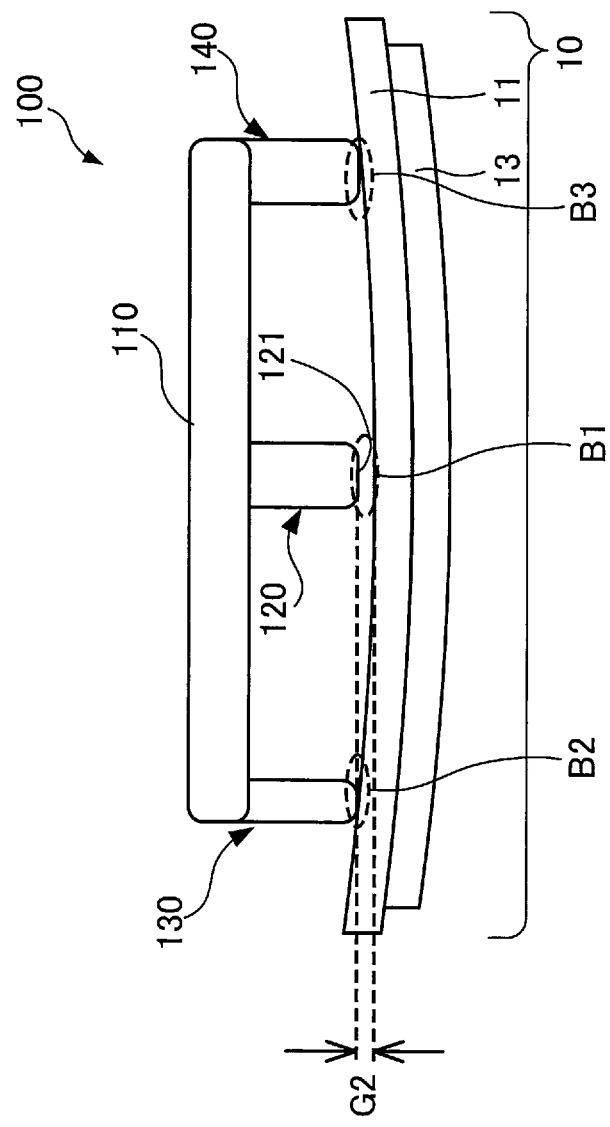

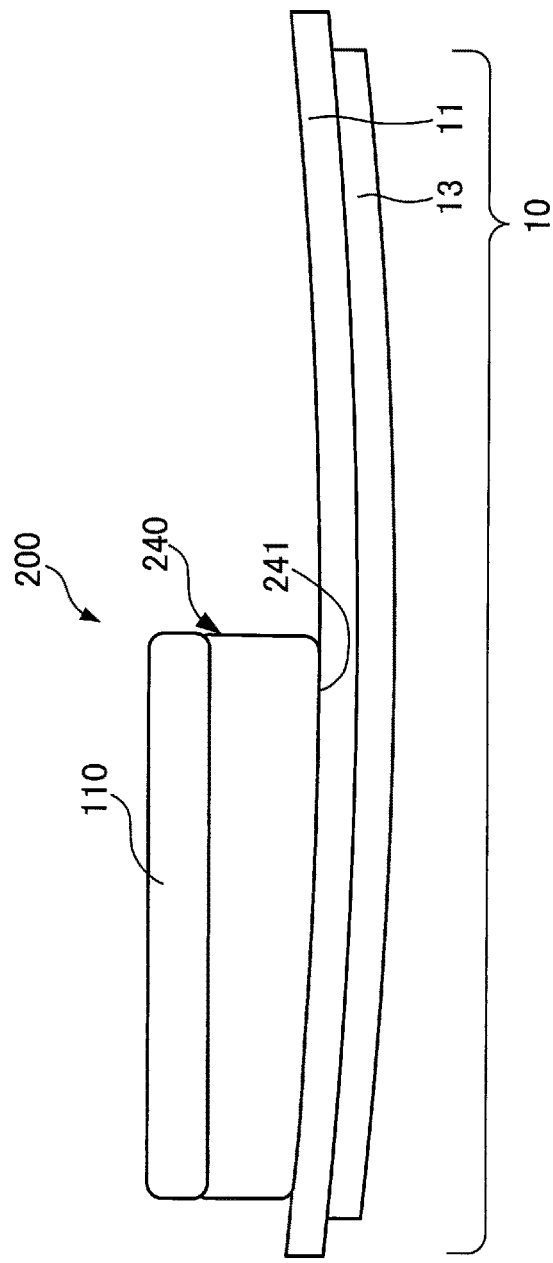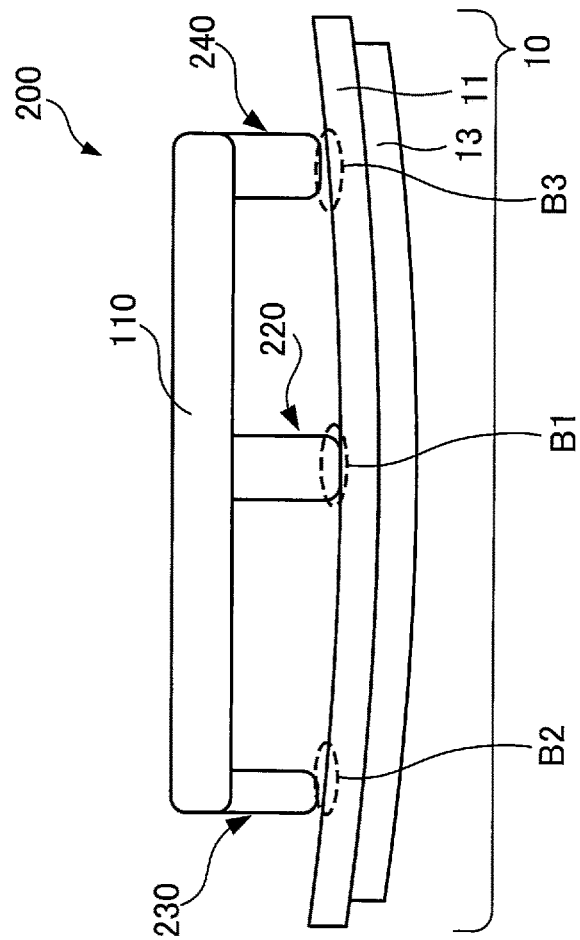

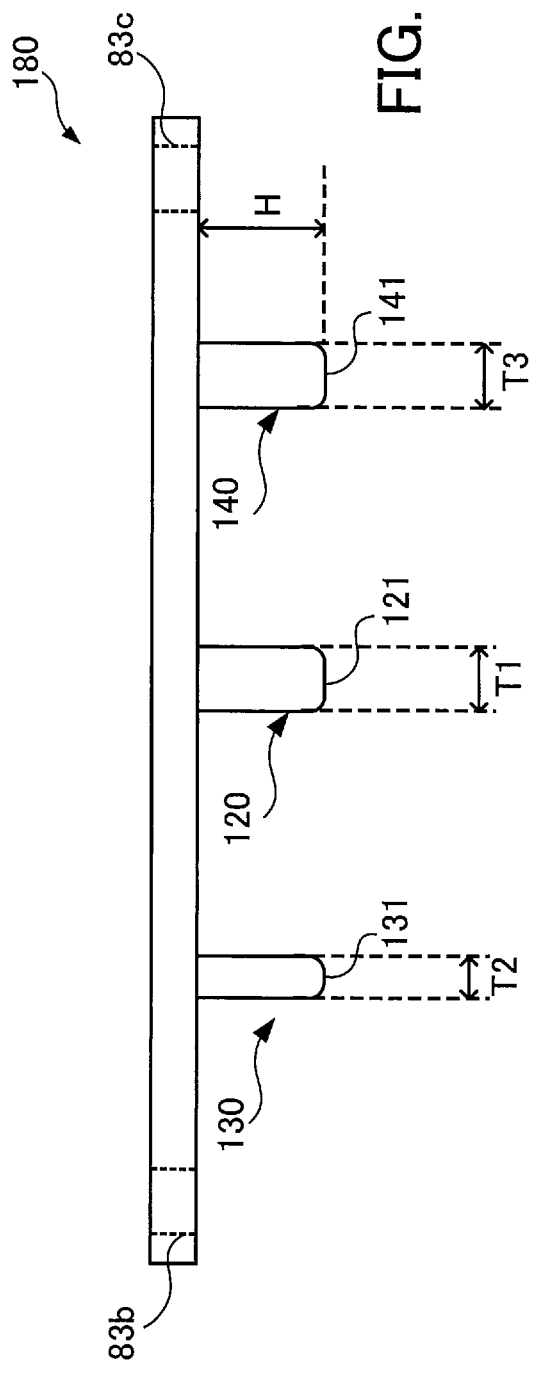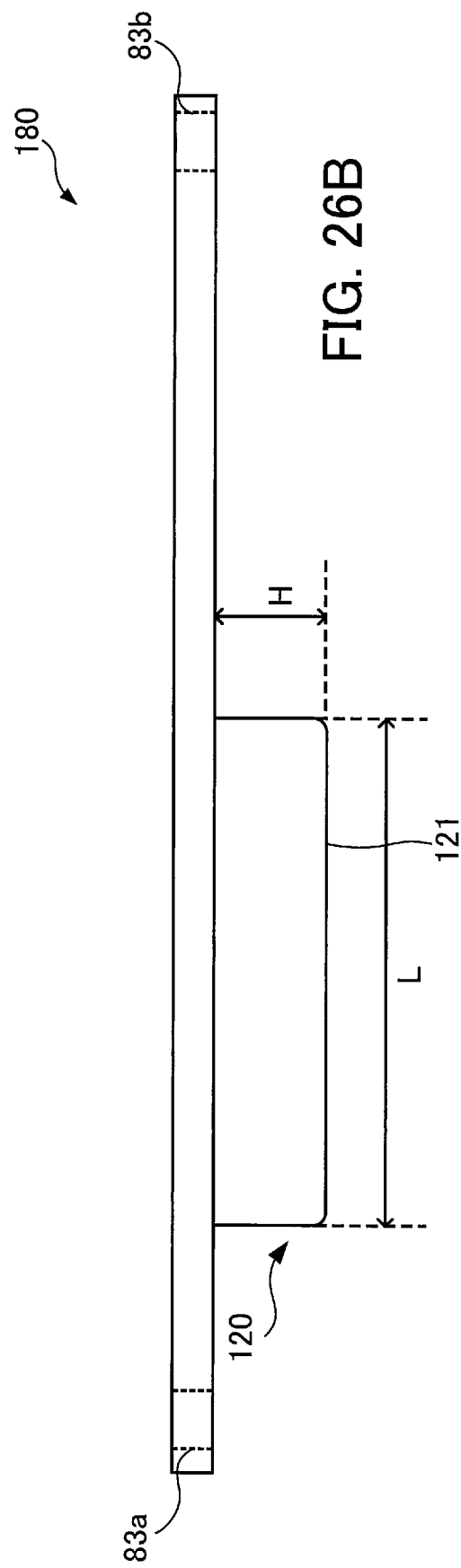

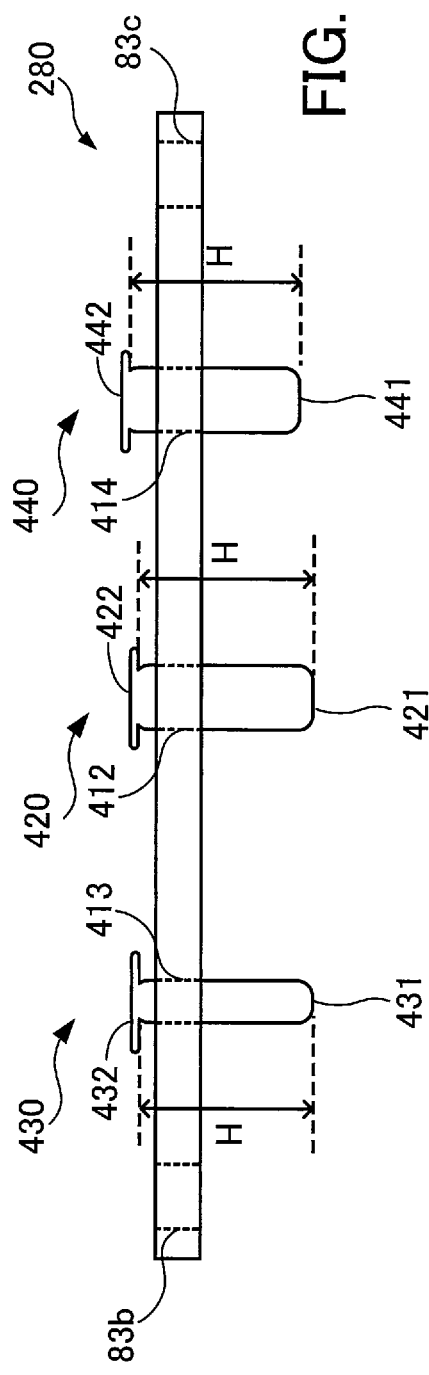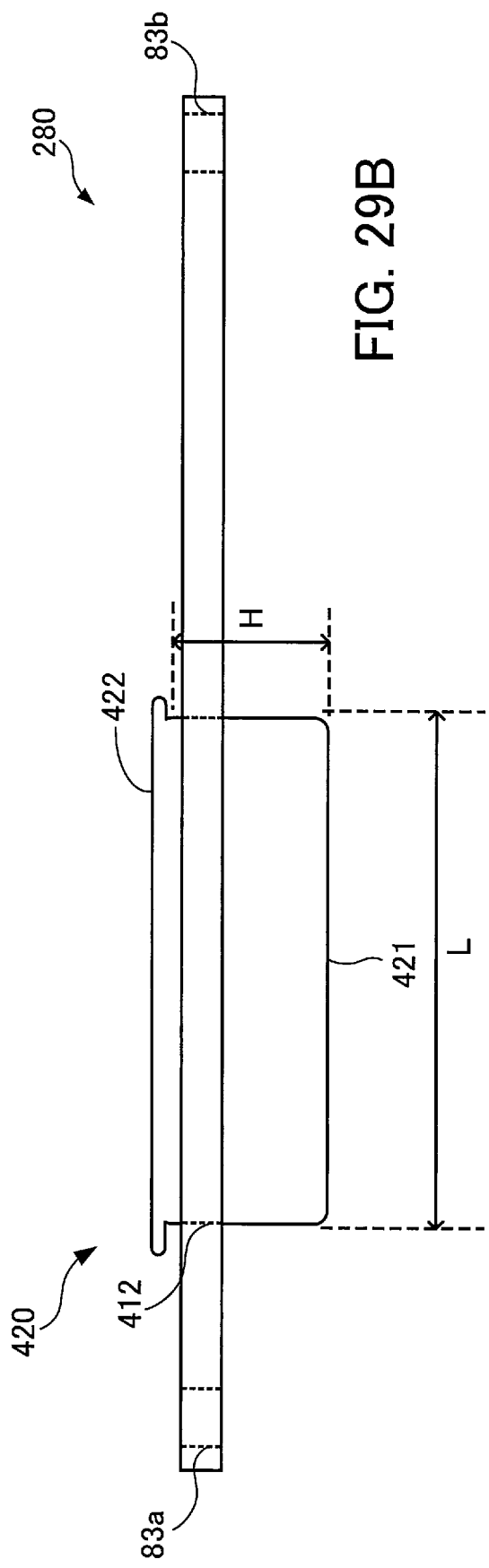

SEMICONDUCTOR DEVICE MANUFACTURING METHOD AND SOLDERING SUPPORT JIG

CROSS-REFERENCE TO RELATED APPLICATION

This application is based upon and claims the benefit of priority of the prior Japanese Patent Application No. 2017-157692, filed on Aug. 17, 2017, the entire contents of which are incorporated herein by reference.

BACKGROUND

1. Field

The embodiments discussed herein relate to a semiconductor device manufacturing method and a soldering support jig.

2. Related Art

Semiconductor devices including semiconductor elements such as insulated gate bipolar transistors (IGBTs) or power metal-oxide-semiconductor field-effect transistors (MOSFETs) are used, for example, as power converters. Such a semiconductor device also includes a ceramic circuit board including an insulating plate and a plurality of circuit patterns. These circuit patterns are formed on the front surface of the insulating plate, and the semiconductor elements are arranged on these circuit patterns. In addition, cylindrical contact components on which external terminals are mounted are arranged at predetermined positions on these circuit patterns.

When this semiconductor device is manufactured, the contact components need to be accurately arranged at the predetermined positions on the circuit patterns of the ceramic circuit board. Thus, the following manufacturing process is used to manufacture the semiconductor device.

FIG. 30 illustrates a soldering process in a semiconductor device manufacturing method.

More specifically, FIG. 30 illustrates an enlarged main portion of a semiconductor device during a soldering process in a semiconductor device manufacturing method.

A ceramic circuit board 600 includes an insulating plate 601, a plurality of circuit patterns arranged on the front surface of the insulating plate 601, and a metal plate 603 arranged on the back surface of the insulating plate 601. Among the plurality of circuit patterns, circuit patterns 602a and 602b are illustrated in FIG. 30.

The ceramic circuit board 600 is set on a substrate positioning jig 650, and solder is applied to arrangement areas on the circuit patterns 602a and 602b of the ceramic circuit board 600. Semiconductor elements 611 to 613 and a plurality of contact components are to be arranged on the arrangement areas. Among the plurality of contact components, a contact component 614 is illustrated in FIG. 30. Next, the semiconductor elements 611 to 613 are arranged on the predetermined arrangement areas via the solder.

In addition, a plate-like positioning jig 660 is set on the ceramic circuit board 600. In this plate-like positioning jig 660, a plurality of positioning holes are formed at positions corresponding to predetermined arrangement areas on which the contact components are to be arranged. In FIG. 30, among the plurality of positioning holes, a positioning hole 661 that corresponds to the contact component 614 is illustrated. Next, the contact component 614 is arranged in the positioning hole 661.

Next, as illustrated in FIG. 30, a contact component pressing jig 670 is set on the positioning jig 660, and a reflow soldering step is performed. This reflow soldering step includes a heating process under reduced pressure while moving the contact component pressing jig 670 toward the substrate positioning jig 650 to press the contact component 614 toward the ceramic circuit board 600. In this reflow soldering step, since the solder is melted and solidified, the semiconductor elements 611 to 613 and the contact component 614 are fixed on the circuit patterns 602a and 602b of the ceramic circuit board 600 via solder 621, 622, 623, and 624.

Through the above process, the semiconductor elements 611 to 613 and the contact component 614 are arranged at the predetermined positions on the circuit patterns 602a and 602b of the ceramic circuit board 600. See, for example, Japanese Laid-open Patent Publication No. 2014-187179.

The various jigs are removed from the ceramic circuit board 600 on which the semiconductor elements 611 to 613 and the contact component 614 are arranged as described above. Next, main electrodes of the semiconductor elements 611 to 613 are electrically connected to the circuit patterns 602a and 602b by bonding wires, and an external connection terminal not illustrated is mounted on the contact component 614.

Finally, by sealing the components arranged on the ceramic circuit board 600 with a sealing member, the semiconductor device is formed.

In the reflow soldering step in the semiconductor device manufacturing method, the solder melts when heated, as described above. In the reflow soldering step, especially when the solder includes flux, small solder pieces are scattered as the flux foams. For example, as illustrated in FIG. 30, if small solder pieces 621a and 622a are scattered from the heated solder, the scattered small solder pieces 621a and 622a are attached to a connection area 602b1 on the circuit pattern 602b where a wiring member such as a bonding wire is connected. If the small solder pieces 621a and 622a are attached to the connection area 602b1, a wiring member such as a bonding wire could not be connected to the connection area 602b1. Consequently, since the attached small solder pieces 621a and 622a need to be removed from the connection area 602b1, the number of steps for manufacturing the semiconductor device is increased. There are cases in which the small solder pieces 621a and 622a attached to the connection area 602b1 could not be removed.

SUMMARY

In one aspect of the embodiments, there is provided a semiconductor device manufacturing method including: preparing a component, a wiring member, a solder, and a substrate, the substrate having an arrangement area on which the component is to be arranged and a connection area to which the wiring member is to be directly connected, the connection area including a neighboring connection area neighboring the arrangement area; applying the solder to the arrangement area of the substrate; arranging the component on the arrangement area via the solder; and soldering the component to the arrangement area by heating the solder while covering the neighboring connection area.

Additional aspects and/or advantages will be set forth in part in the description which follows and, in part, will be apparent from the description, or may be learned by practice of the invention.

It is to be understood that both the foregoing general description and the following description of embodiments provide illustrative examples and explanations and are not restrictive of the invention.

BRIEF DESCRIPTION OF THE DRAWINGS

FIGS. 18A and 18B illustrate cases in which the ceramic circuit board has been warped by a reflow soldering step in the semiconductor device manufacturing method according to the second embodiment;

FIGS. 20A and 20B illustrate cases in which a ceramic circuit board has been warped by a reflow soldering step in the semiconductor device manufacturing method according to the third embodiment;

FIGS. 26A and 26B are sectional views of the pressing jig used in the semiconductor device manufacturing method according to the seventh embodiment;

FIGS. 29A and 29B are sectional views of the pressing jig used in the semiconductor device manufacturing method according to the eighth embodiment.

DESCRIPTION OF EMBODIMENTS

Figure 1:
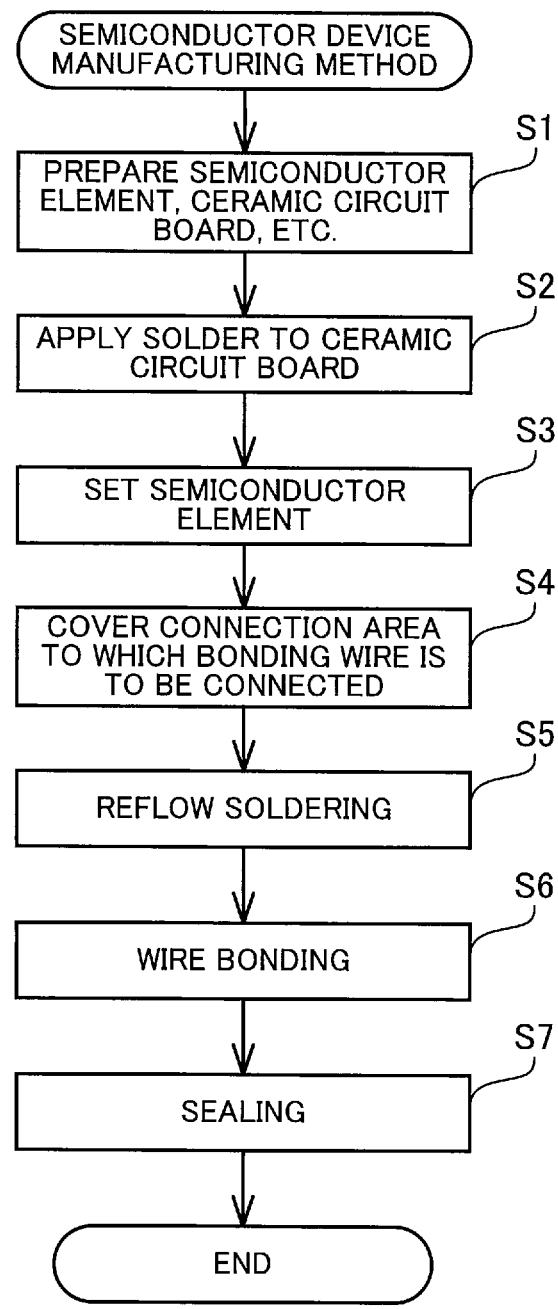
FIG. 1 is a flowchart illustrating a semiconductor device manufacturing method according to a first embodiment.

Hereinafter, several embodiments will be described with reference to the accompanying drawings, wherein like reference characters refer to like elements throughout.

First Embodiment

A semiconductor device manufacturing method according to a first embodiment will be described with reference to FIG. 1 and FIGS. 2A to 2E.

FIG. 1 is a flowchart illustrating a semiconductor device manufacturing method according to a first embodiment, and FIGS. 2A to 2E illustrate steps of the semiconductor device manufacturing method according to the first embodiment.

[Step S1] A semiconductor element, a ceramic circuit board, etc., which are components of a semiconductor device, are prepared.

Figure 2A:
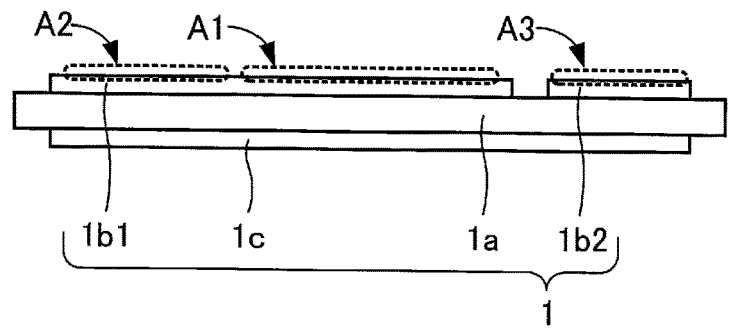
FIGS. 2A to 2E illustrate steps of the semiconductor device manufacturing method according to the first embodiment.

For example, as illustrated in FIG. 2A, a ceramic circuit board 1 (a substrate) includes an insulating plate 1$a$, circuit patterns 1$b$1 and 1$b$2 formed on the front surface of the insulating plate 1*a*, and a metal plate 1*c* formed on the back surface of the insulating plate 1*a*. The circuit pattern 1*b*1 has a principal surface on which an arrangement area A1 on which the semiconductor element is to be arranged and a neighboring connection area A2 which is to be electrically connected to a main electrode of a semiconductor element and which neighbors the arrangement area A1 are set. In addition, the circuit pattern 1*b*2 has a principal surface on which a neighboring connection area A3 which is to be electrically connected to a main electrode of a semiconductor element and which neighbors the arrangement area A1 is set. Among the other connection areas, which are not illustrated, on the circuit patterns 1*b*1 and 1*b*2, the neighboring connection areas A2 and A3 neighbor the arrangement area A1.

[Step S2] Solder is applied to a predetermined area on a circuit pattern of the ceramic circuit board.

Figure 2B:
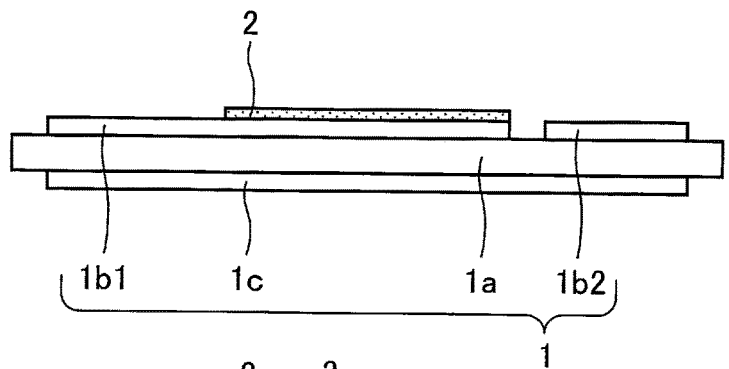

For example, as illustrated in FIG. 2B, solder 2 is applied to the arrangement area A1 of the semiconductor element on the circuit pattern 1*b*1 of the ceramic circuit board 1.

[Step S3] The semiconductor element is set on the corresponding arrangement area on the circuit pattern of the ceramic circuit board via the solder applied in step S2. Components other than the semiconductor element, for example, a lead frame, an external connection terminal such as a pin terminal, a contact component, etc., or an electronic component such as a thermistor or a current sensor may also be set on the arrangement area.

Figure 2C:
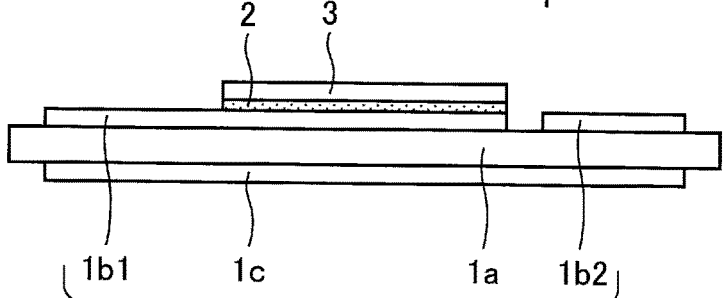

For example, as illustrated in FIG. 2C, a semiconductor element 3 is set on the arrangement area A1 on the circuit board (the circuit pattern 1*b*1) of the ceramic circuit board 1 via the solder 2.

[Step S4] A connection area to which a bonding wire is to be connected on a circuit pattern of the ceramic circuit board is covered.

Figure 2D:
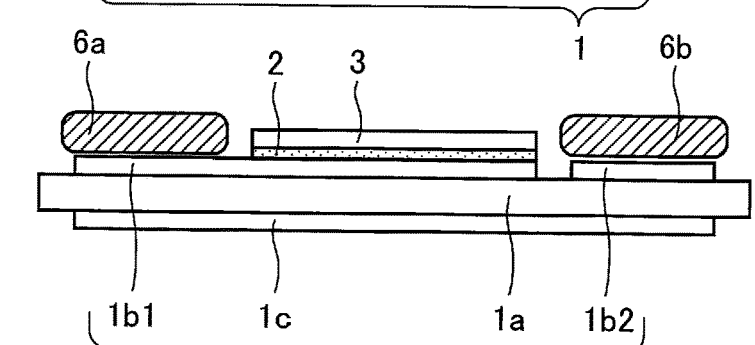

For example, as illustrated in FIG. 2D, soldering support jigs 6*a* and 6*b* are set on the neighboring connection areas A2 and A3, respectively, on the circuit patterns 1*b*1 and 1*b*2 of the ceramic circuit board 1. Consequently, the neighboring connection areas A2 and A3 on the circuit patterns 1*b*1 and 1*b*2 of the ceramic circuit board 1 are covered.

[Step S5] After the individual neighboring connection areas of the ceramic circuit board have been covered in step S4 (for example, see FIG. 2D), a reflow soldering step is performed. In this reflow soldering step, the solder is heated to be melted so that the semiconductor element is fixed to the arrangement area via the solder.

In this step, especially when the solder 2 contains flux, the flux vaporizes and foams when the solder 2 is heated. Thus, if the reflow soldering step were performed without covering the neighboring connection areas A2 and A3 (see the state illustrated in FIG. 2C), melted small solder pieces would be scattered onto the neighboring connection areas A2 and A3 on the circuit patterns 1*b*1 and 1*b*2 from the solder 2 under the semiconductor element 3.

However, according to the first embodiment, as illustrated in FIG. 2D, the reflow soldering step is performed after the neighboring connection areas A2 and A3 on the circuit patterns 1*b*1 and 1*b*2 are covered by the soldering support jigs 6*a* and 6*b*. Thus, the scattered small solder pieces are prevented from being attached to the neighboring connection areas A2 and A3 on the circuit patterns 1*b*1 and 1*b*2.

[Step S6] A main electrode of the semiconductor element is electrically connected to the corresponding connection area on the circuit pattern of the ceramic circuit board.

Figure 2E:
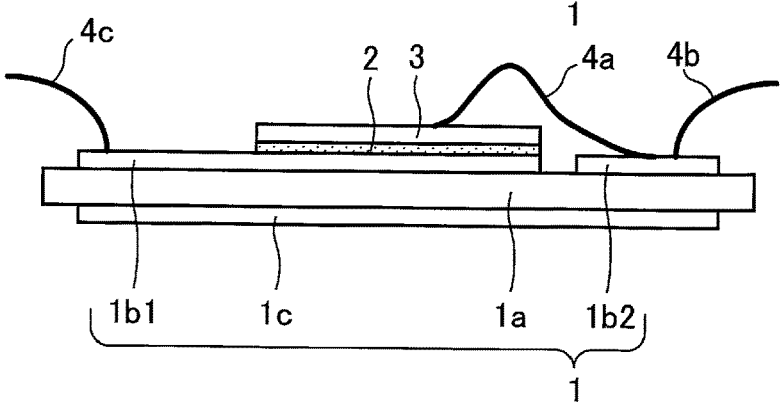

For example, as illustrated in FIG. 2E, after the soldering support jigs 6*a* and 6*b* are removed from the neighboring connection areas A2 and A3 on the circuit patterns 1*b*1 and 1*b*2, a main electrode of the semiconductor element 3 is electrically connected to the neighboring connection area A3 on the circuit pattern 1*b*2 of the ceramic circuit board 1 by a bonding wire 4*a*.

In addition, external connection terminals not illustrated are connected to the neighboring connection areas A2 and A3 on the circuit patterns 1*b*1 and 1*b*2 of the ceramic circuit board 1 by bonding wires 4*c* and 4*b*.

Since the neighboring connection areas A2 and A3 on the circuit patterns 1*b*1 and 1*b*2 had been covered by the soldering support jigs 6*a* and 6*b* in step S5, scattered small solder pieces are not attached to the neighboring connection areas A2 and A3. Thus, no small solder pieces need to be removed from the neighboring connection areas A2 and A3 on the circuit patterns 1*b*1 and 1*b*2. In addition, the bonding wire 4*c* and the bonding wires 4*a* and 4*b* are properly connected to the neighboring connection areas A2 and A3 on the circuit patterns 1*b*1 and 1*b*2.

[Step S7] The semiconductor element, the bonding wires, etc. arranged on the ceramic circuit board are sealed by a sealing member not illustrated.

In this way, the semiconductor device not illustrated is manufactured. In step S3, when the semiconductor element is set on the arrangement area on the circuit pattern of the ceramic circuit board, a plate-like substrate positioning jig (not illustrated) that has an opening corresponding to the arrangement area may be used. In step S5, a pressing jig (not illustrated) for pressing the semiconductor element 3 toward the circuit pattern 1*b*1 during the reflow soldering step may be used. The above soldering support jigs 6*a* and 6*b* may be used with soldering jigs that includes the substrate positioning jig and the pressing jig.

According to the above semiconductor device manufacturing method, the semiconductor element 3 and the ceramic circuit board 1 are prepared. The ceramic circuit board 1 includes the insulating plate 1*a* and the circuit patterns 1*b*1 and 1*b*2 formed on the front surface of the insulating plate 1*a* and having principal surfaces on which the arrangement area A1 on which the semiconductor element 3 is to be arranged and the neighboring connection areas A2 and A3 to which the bonding wires 4*a* to 4*c* are to be directly connected are set. Components other than the semiconductor element 3, for example, a lead frame, an external connection terminal such as a pin terminal, a contact component, etc., or an electronic component such as a thermistor or a current sensor may be arranged in the arrangement area A1.

In addition, the solder 2 is applied to the arrangement area A1 of the ceramic circuit board 1, and the semiconductor element 3 is arranged on the arrangement area A1 via the solder 2. Next, after the neighboring connection areas A2 and A3 of the ceramic circuit board 1 are covered by the soldering support jigs 6*a* and 6*b*, the solder 2 is heated to be melted and solidified so that the semiconductor element 3 is fixed to the arrangement area A1 of the ceramic circuit board 1 via the solder 2.

When the semiconductor element 3 is fixed to the arrangement area A1 via the solder 2 by melting and solidifying the solder 2, the neighboring connection areas A2 and A3 of the ceramic circuit board 1 have already been covered by the soldering support jigs 6*a* and 6*b*. Thus, the small solder pieces scattered from the solder 2 under the semiconductor element 3 are prevented from being attached to the neighboring connection areas A2 and A3 on the circuit patterns 1*b*1 and 1*b*2.

Thus, no small solder pieces need to be removed from the neighboring connection areas A2 and A3 on the circuit patterns 1b1 and 1b2. More specifically, no small solder pieces are attached to the neighboring connection areas A2 and A3 on the circuit patterns 1b1 and 1b2. Namely, the bonding wires 4a to 4c are properly connected to the neighboring connection areas A2 and A3 on the circuit patterns 1b1 and 1b2.

Thus, it is possible to manufacture a reliable semiconductor device without increasing the number of manufacturing steps in a semiconductor device manufacturing method.

The first embodiment has been described by using an example in which the semiconductor element 3 is connected to the circuit pattern 1b2 by a bonding wire. However, the embodiment is not limited to the above example. One circuit pattern may be connected to another circuit pattern by a bonding wire and individual connection areas for connecting the circuit patterns to external connection terminals may be covered by soldering support jigs so that small solder pieces are not attached to the connection areas.

Second Embodiment

In a second embodiment, the first embodiment will be described more specifically.

First, a semiconductor device according to the second embodiment will be described with reference to FIGS. 3 and 4.

Figure 3:
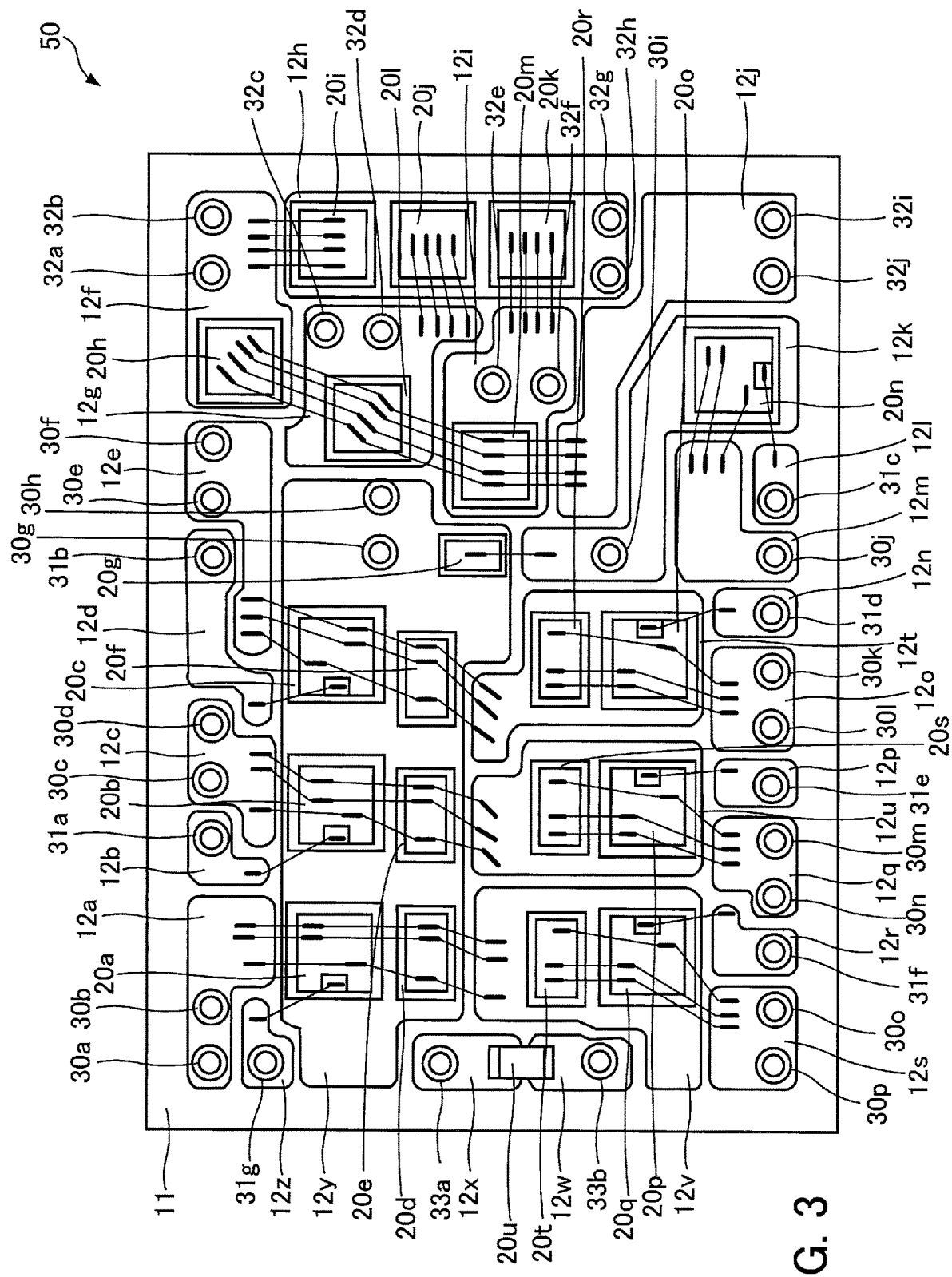
FIG. 3 is a plan view of a semiconductor device according to a second embodiment.
Figure 4:
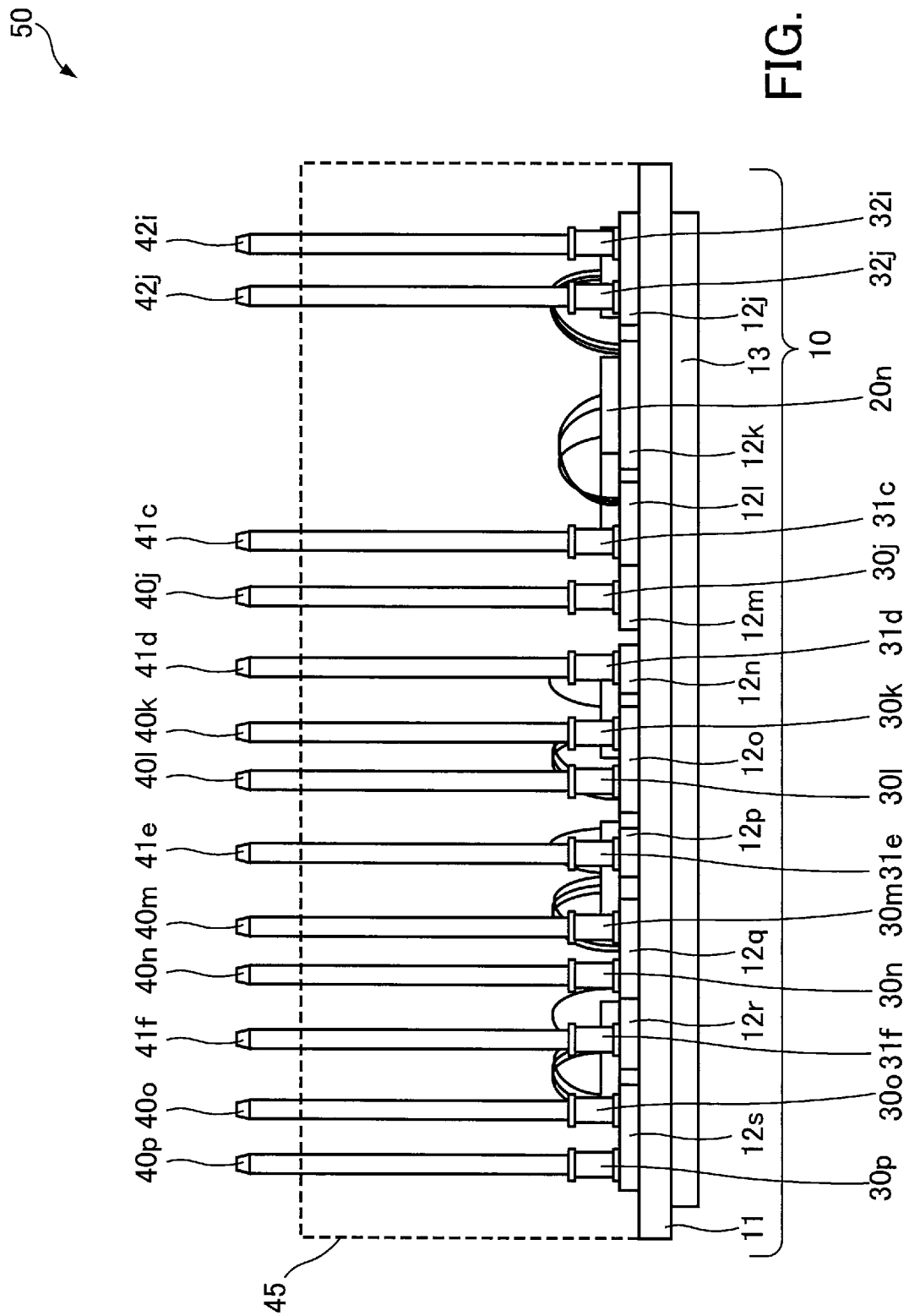
FIG. 4 is a side view of the semiconductor device according to the second embodiment.

FIG. 3 is a plan view of a semiconductor device according to the second embodiment, and FIG. 4 is a side view of the semiconductor device according to the second embodiment. While FIG. 3 does not illustrate a sealing member 45, FIG. 4 illustrates the sealing member 45 with a dashed line. In addition, FIG. 4 illustrates bonding wires electrically connecting circuit patterns and main electrodes of semiconductor elements.

As illustrated in FIGS. 3 and 4, a semiconductor device 50 includes a ceramic circuit board 10 (a substrate), semiconductor elements 20a to 20t, and an electronic component 20u. The semiconductor elements 20a to 20t and the electronic component 20u are bonded to the front surface of the ceramic circuit board 10. The semiconductor device 50 also includes contact components 30a to 30p, 31a to 31g, 32a to 32j, 33a, and 33b bonded to the front surface of the ceramic circuit board 10 and bonding wires electrically connecting the front surface of the ceramic circuit board 10 and main electrodes of the semiconductor elements. These bonding wires are not denoted by reference characters. External connection terminals not illustrated in FIG. 3 are individually mounted on the contact components 30a to 30p, 31a to 31g, 32a to 32j, 33a, and 33b. For example, external connection terminals 40p, 40o, 41f, 40n, 40m, 41e, 40l, 40k, 41d, 40j, 41c, 42j, and 42i are mounted on the contact components 30p, 30o, 31f, 30n, 30m, 31e, 30l, 30k, 31d, 30j, 31c, 32j, and 32i that are arranged along a long side of the ceramic circuit board 10, respectively. In addition, the semiconductor device 50 including the semiconductor elements 20a to 20t and the electronic component 20u that are arranged on the front surface of the ceramic circuit board 10 is sealed by the sealing member 45 in such a manner that end portions of the external connection terminals that are mounted on the contact components 30a to 30p, 31a to 31g, 32a to 32j, 33a, and 33b protrude from the sealing member 45.

Hereinafter, unless the semiconductor elements 20a to 20t need to be distinguished from each other, these reference characters may be omitted. The same is true of the contact components 30a to 30p, 31a to 31g, 32a to 32j, 33a, and 33b.

The ceramic circuit board 10 includes an insulating plate 11, a plurality of circuit patterns 12a to 12z formed on the front surface of the insulating plate 11, and a metal plate 13 formed on the back surface of the insulating plate 11.

The insulating plate 11 is formed by ceramics with high thermal conductivity such as aluminum oxide, aluminum nitride, or silicon nitride.

The plurality of circuit patterns 12a to 12z are each formed by a material with high electrical conductivity. For example, the circuit patterns 12a to 12z are each formed by a material such as silver, copper, nickel, or an alloy that includes at least one of these materials. Hereinafter, unless the circuit patterns 12a to 12z need to be distinguished from each other, these reference characters may be omitted.

The metal plate 13 is formed by metal with high thermal conductivity such as aluminum, iron, silver, copper, or an alloy that includes at least one of these materials.

For example, as the ceramic circuit board 10 having the structure as described above, a direct copper bonding (DCB) substrate or an active metal brazed (AMB) substrate may be used. By mounting a heat radiating part not illustrated on the metal plate 13 of the ceramic circuit board 10, it is possible to transfer the heat generated by the semiconductor elements to the heat radiating part via the circuit patterns 12a to 12z, the insulating plate 11, and the metal plate 13.

For example, the insulating plate 11 has a rectangular shape in a plan view. The metal plate 13 has a rectangular shape having a smaller area than the insulating plate 11 in a plan view. Consequently, the ceramic circuit board 10 has a rectangular shape, for example.

For example, each of the semiconductor elements 20a to 20t includes a switching element such as an IGBT or a power MOSFET formed by silicon or silicon carbide. In this case, for example, each of the semiconductor elements 20a to 20t has a drain or collector electrode as a main electrode on its back surface and has a gate electrode and a source or emitter electrode as main electrodes on its front surface.

In addition, each of the semiconductor elements 20a to 20t includes a diode such as a Schottky barrier diode (SBD) or a freewheeling diode (FWD), as needed. In this case, for example, each of the semiconductor elements 20a to 20t has a cathode electrode as a main electrode on its back surface and has an anode electrode as a main electrode on its front surface. The back surfaces of the above semiconductor elements 20a to 20t are bonded to predetermined circuit patterns not illustrated.

The semiconductor elements 20a to 20t are bonded to the circuit patterns 12a to 12z via solder not illustrated. The solder will be described below.

The bonding wires are each formed by a material with high electrical conductivity. For example, the bonding wires are each formed by a material such as gold, silver, copper, aluminum, or an alloy that includes at least one of these materials. Each of the bonding wires electrically connecting the gate electrodes of the semiconductor elements 20a, 20b, 20c, 20n, 20o, 20p, and 20q and the circuit patterns 12z, 12b, 12d, 12l, 12n, 12p, and 12r has a diameter in a range of 110 µm to 130 µm, and the average diameter is 125 µm, for example. The other individual bonding wires have a diameter in a range of 350 µm to 450 µm, and the average diameter is 400 µm, for example.

For example, the sealing member 45 includes a thermosetting resin, such as a maleimide-modified epoxy resin, a maleimide-modified phenolic resin, or a maleimide resin, and a filler contained in the thermosetting resin. For example, the sealing member 45 includes an epoxy resin and silicon dioxide, aluminum oxide, boron nitride, aluminum nitride, or the like as a filler contained in the epoxy resin.

Next, a method for manufacturing the semiconductor device 50 will be described with reference to FIGS. 5 to 17.

Figure 5:
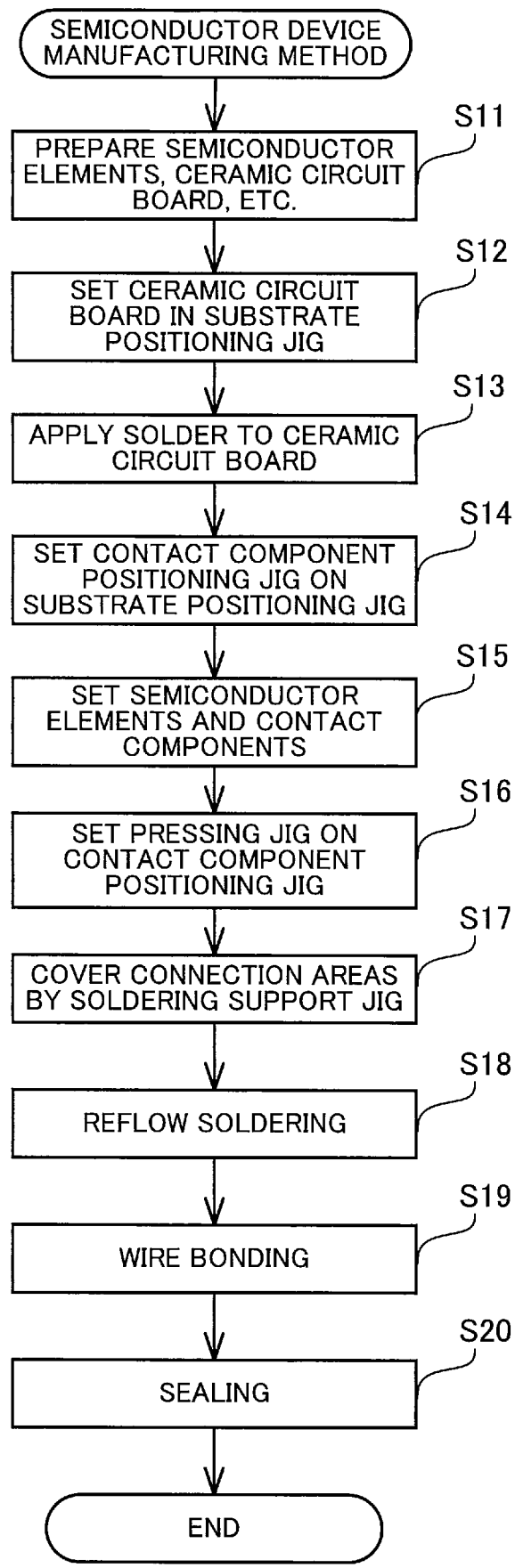
FIG. 5 is a flowchart illustrating a semiconductor device manufacturing method according to the second embodiment.

FIG. 5 is a flowchart illustrating the semiconductor device manufacturing method according to the second embodiment.

Figure 6:
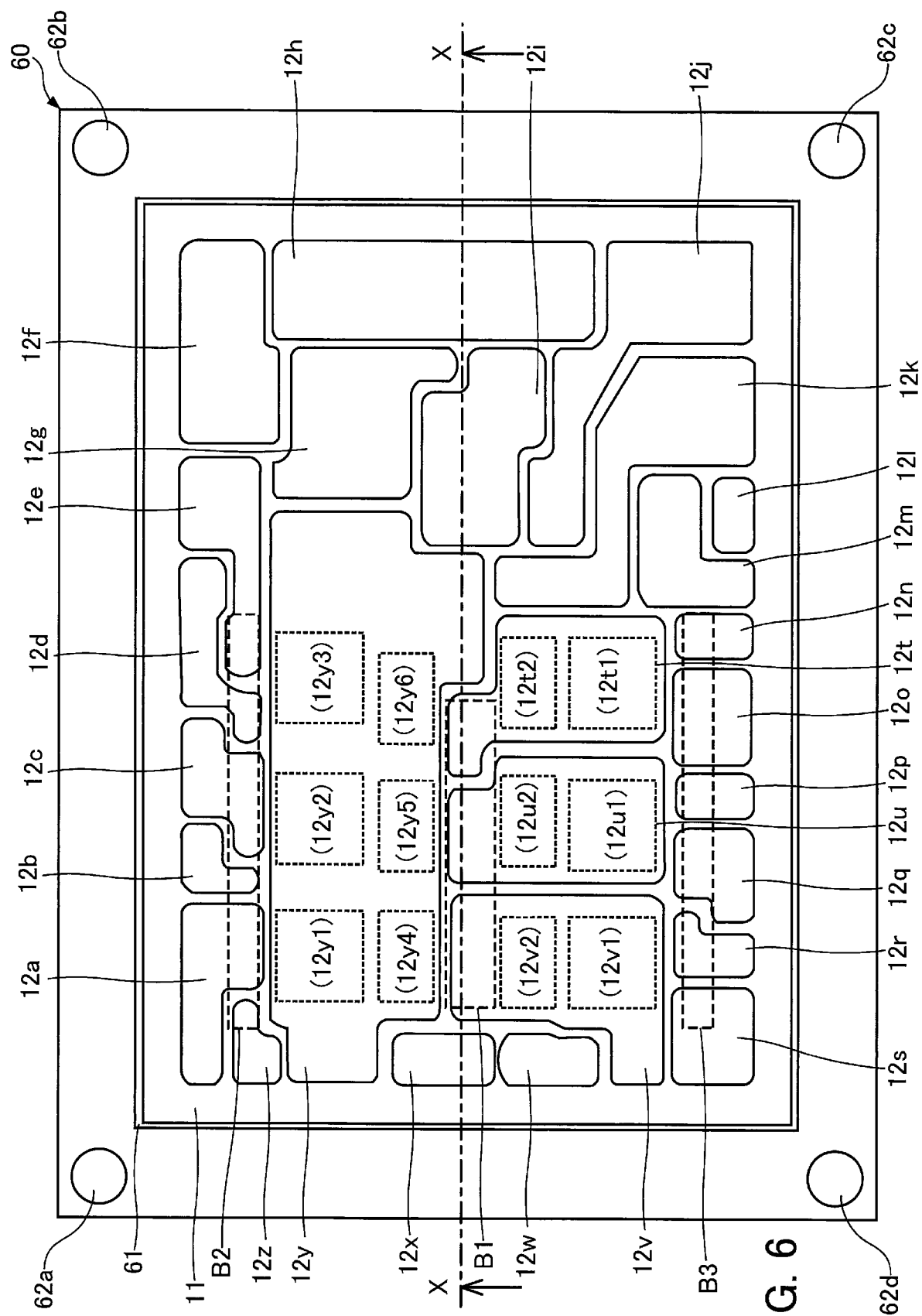
FIG. 6 is a plan view illustrating a step of setting a ceramic circuit board on a substrate positioning jig in the semiconductor device manufacturing method according to the second embodiment.
Figure 7:
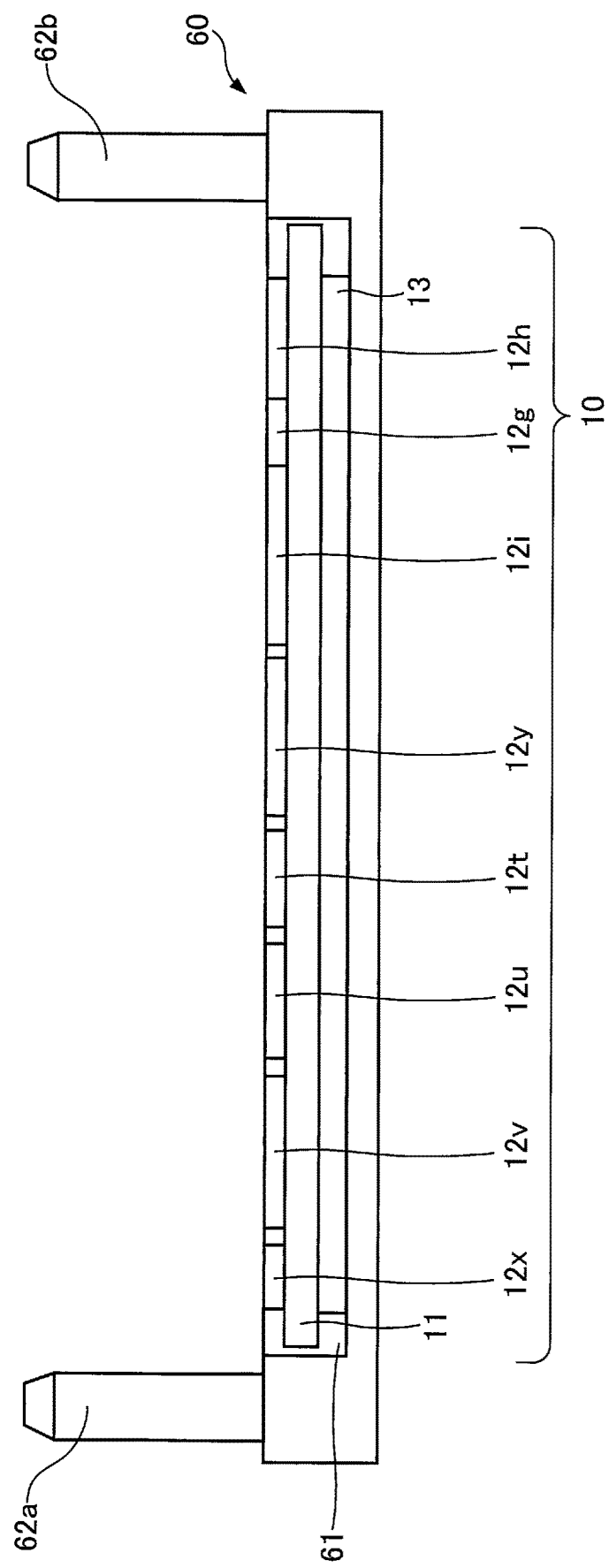
FIG. 7 is a sectional view illustrating the step of setting the ceramic circuit board on the substrate positioning jig in the semiconductor device manufacturing method according to the second embodiment.

FIG. 6 is a plan view illustrating a step of setting a ceramic circuit board on a substrate positioning jig in the semiconductor device manufacturing method according to the second embodiment, and FIG. 7 is a sectional view illustrating the step of setting the ceramic circuit board on the substrate positioning jig in the semiconductor device manufacturing method according to the second embodiment. FIG. 7 is a sectional view taken along an alternate long and short dash line X-X of FIG. 6.

Figure 8:
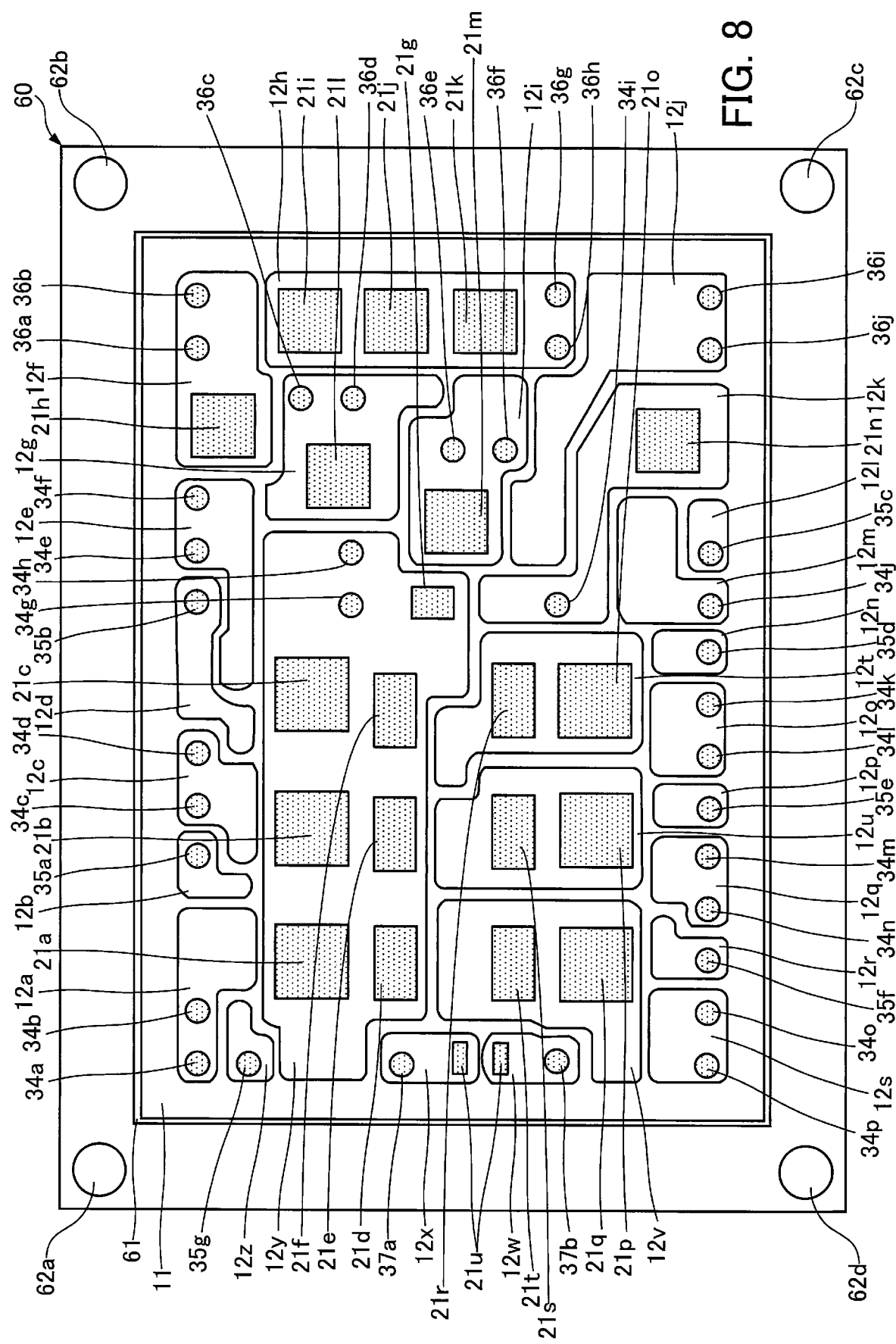
FIG. 8 is a plan view illustrating a step of applying solder to the ceramic circuit board in the semiconductor device manufacturing method according to the second embodiment.

FIG. 8 is a plan view illustrating a step of applying solder to the ceramic circuit board in the semiconductor device manufacturing method according to the second embodiment.

Figure 9:
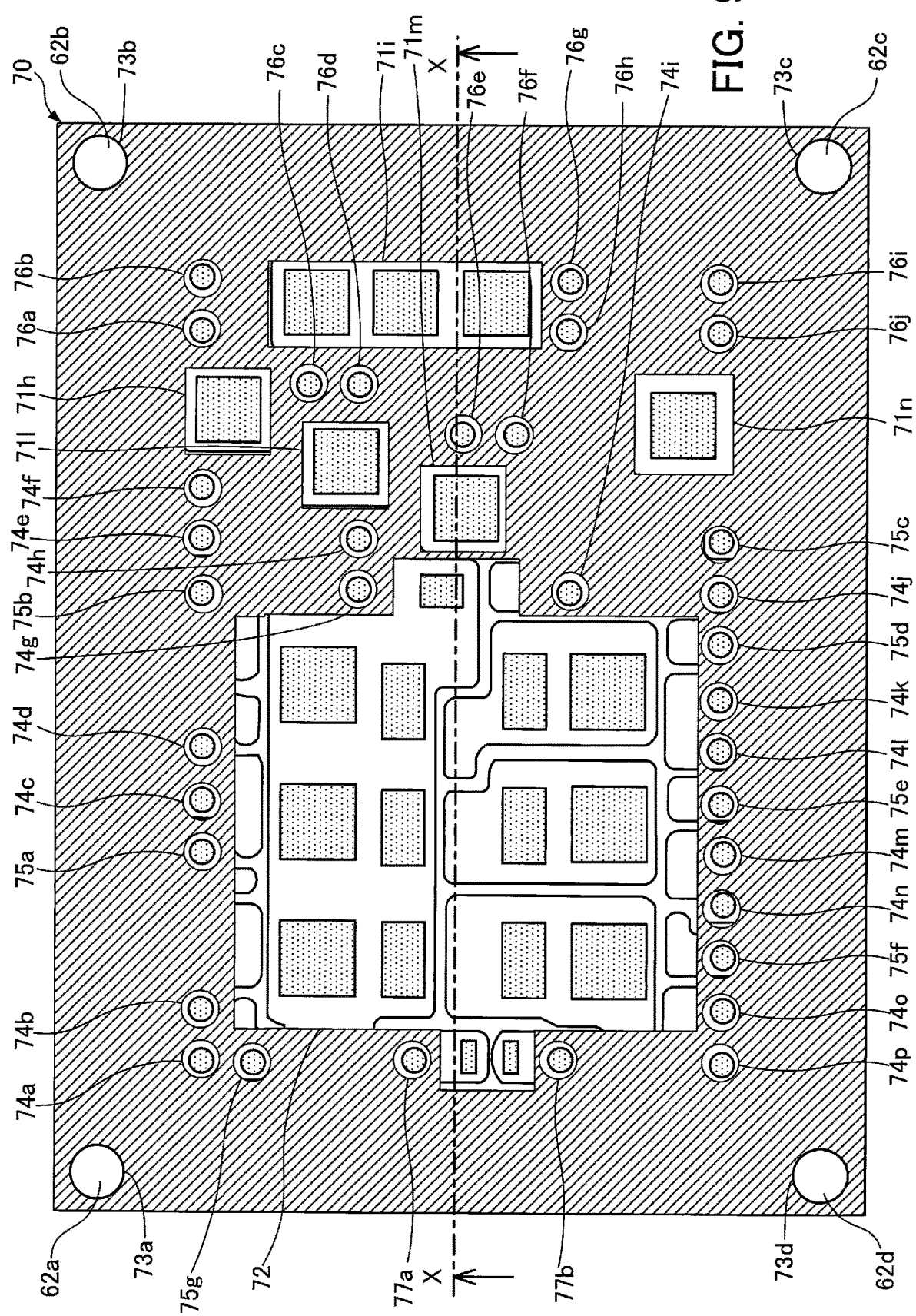
FIG. 9 is a plan view illustrating a step of setting a contact component positioning jig in the semiconductor device manufacturing method according to the second embodiment.
Figure 10:
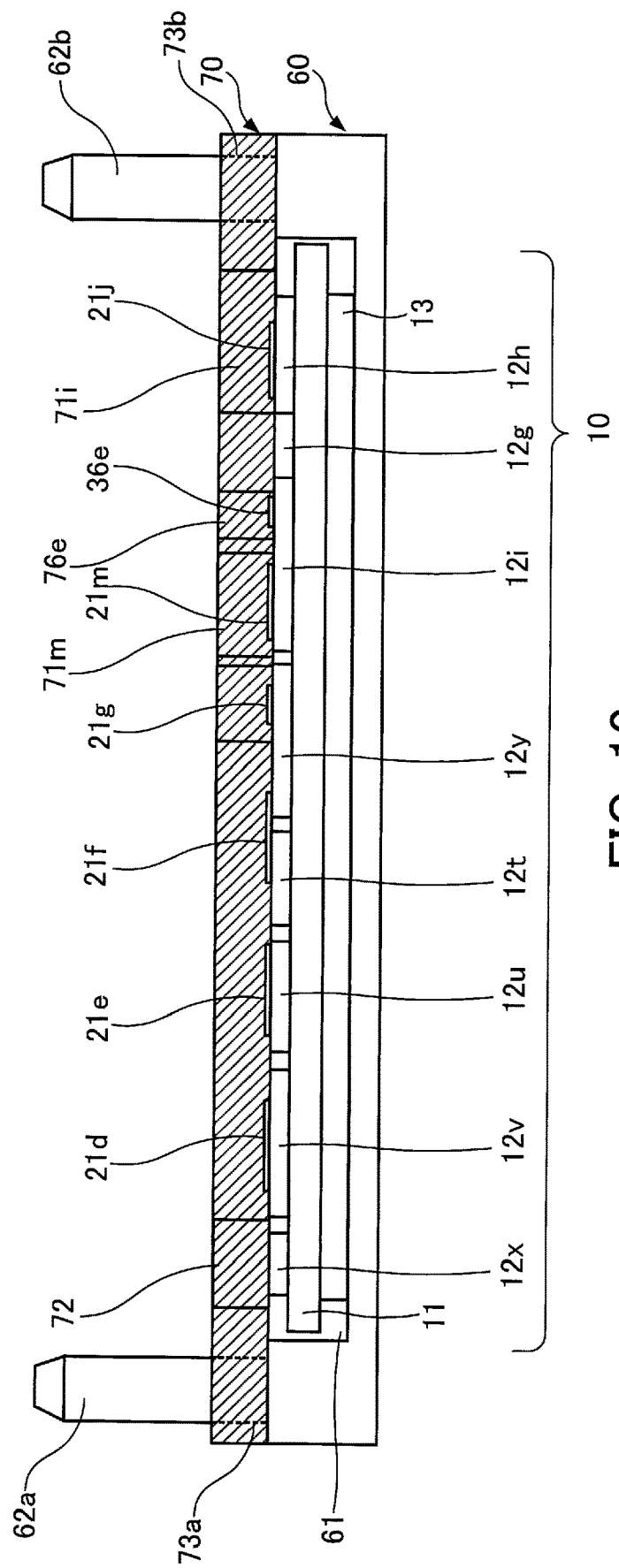
FIG. 10 is a sectional view illustrating the step of setting the contact component positioning jig in the semiconductor device manufacturing method according to the second embodiment.

FIG. 9 is a plan view illustrating a step of setting a contact component positioning jig in the semiconductor device manufacturing method according to the second embodiment, and FIG. 10 is a sectional view illustrating the step of setting the contact component positioning jig in the semiconductor device manufacturing method according to the second embodiment. FIG. 10 is a sectional view taken along an alternate long and short dash line X-X of FIG. 9.

Figure 11:
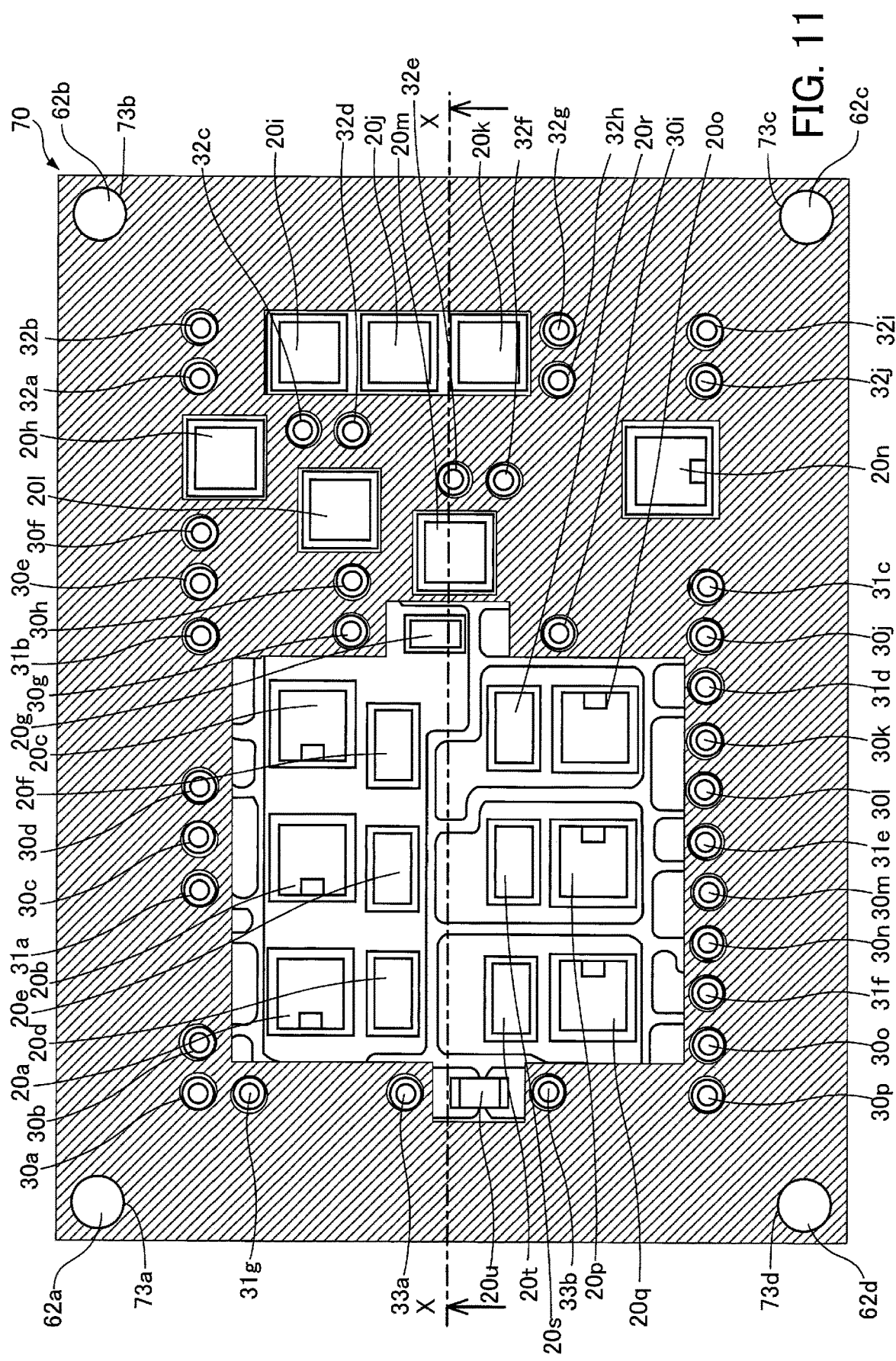
FIG. 11 is a plan view illustrating a step of setting contact components by using the contact component positioning jig in the semiconductor device manufacturing method according to the second embodiment.
Figure 12:
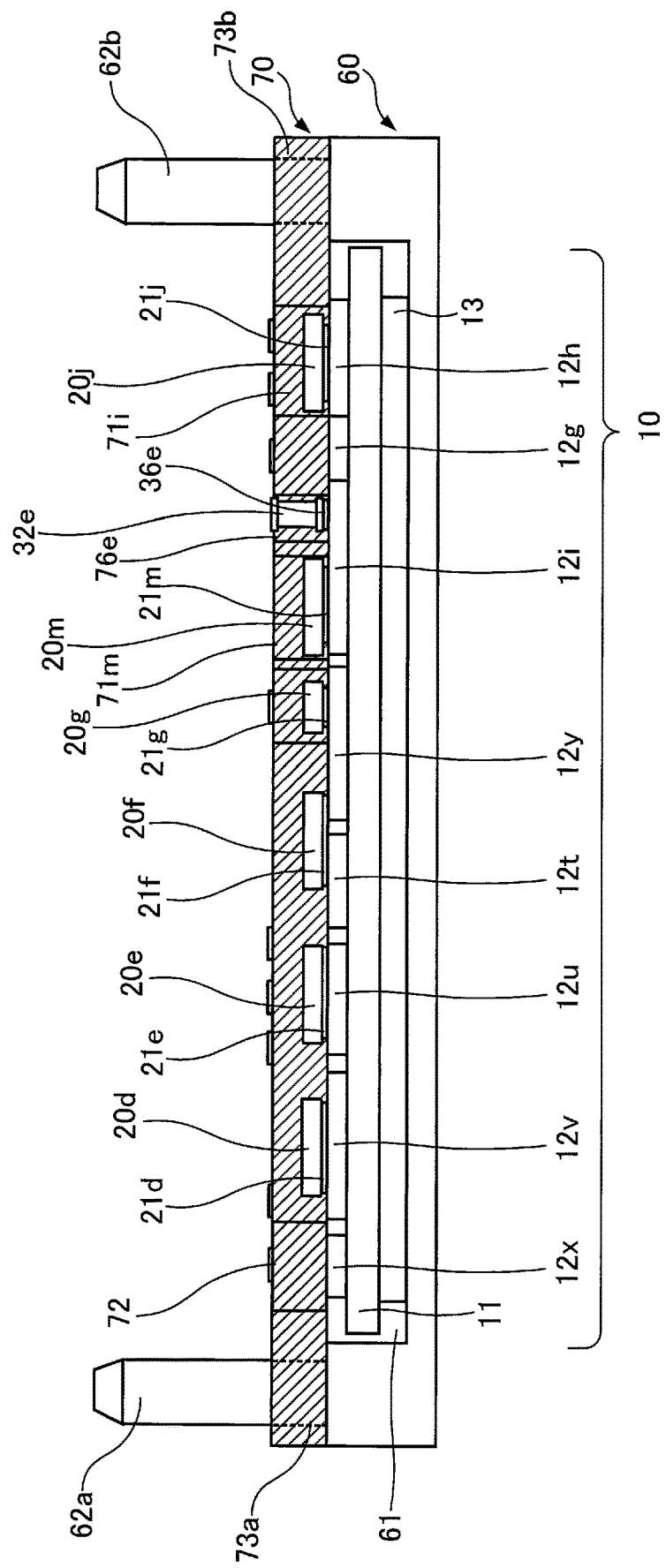
FIG. 12 is a sectional view illustrating the step of setting the contact components by using the contact component positioning jig in the semiconductor device manufacturing method according to the second embodiment.

FIG. 11 is a plan view illustrating a step of setting the contact components by using the contact component positioning jig in the semiconductor device manufacturing method according to the second embodiment, and FIG. 12 is a sectional view illustrating the step of setting the contact components by using the contact component positioning jig in the semiconductor device manufacturing method according to the second embodiment.

Figure 13:
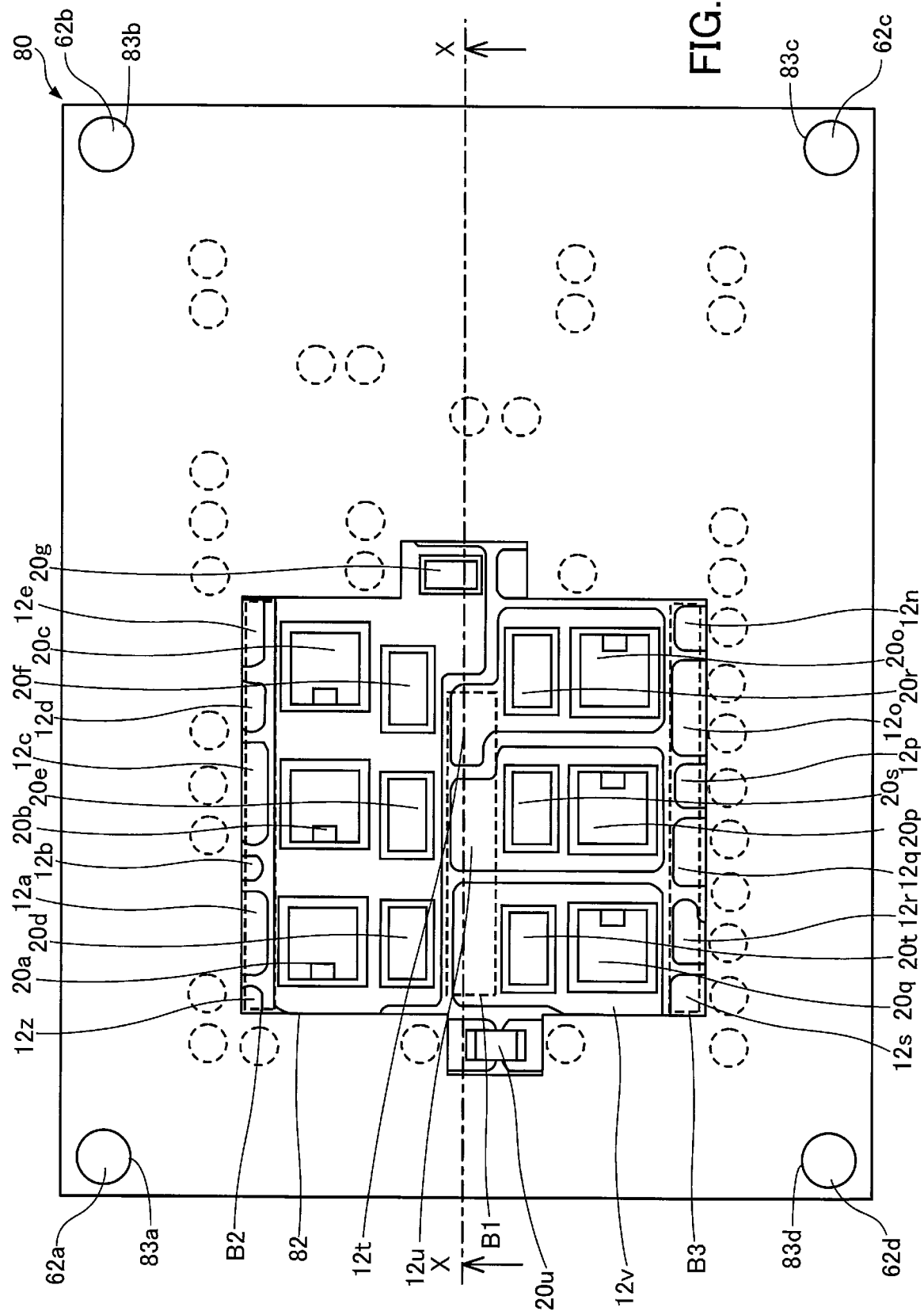
FIG. 13 is a plan view illustrating a step of setting a pressing jig in the semiconductor device manufacturing method according to the second embodiment.
Figure 14:
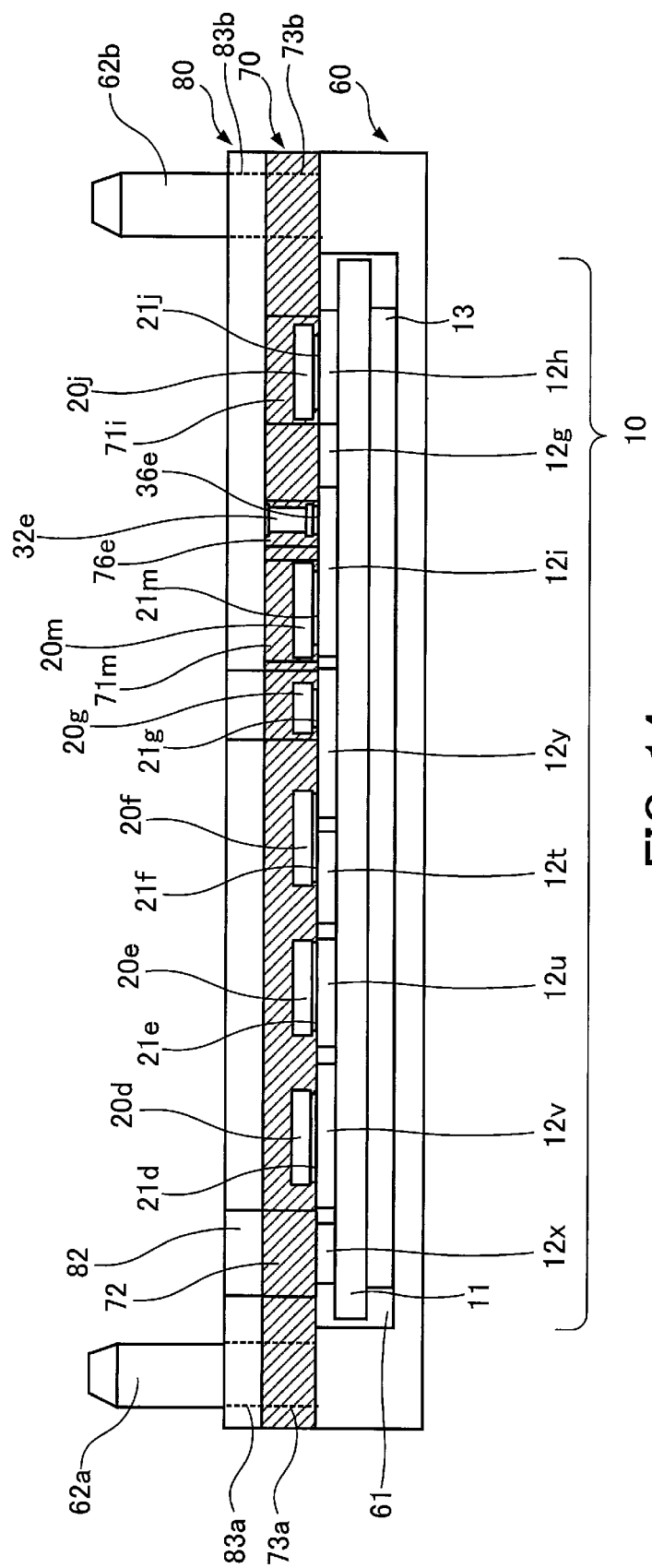
FIG. 14 is a sectional view illustrating the step of setting the pressing jig in the semiconductor device manufacturing method according to the second embodiment.

FIG. 13 is a plan view illustrating a step of setting a pressing jig in the semiconductor device manufacturing method according to the second embodiment, and FIG. 14 is a sectional view illustrating the step of setting the pressing jig in the semiconductor device manufacturing method according to the second embodiment.

Figure 15A:
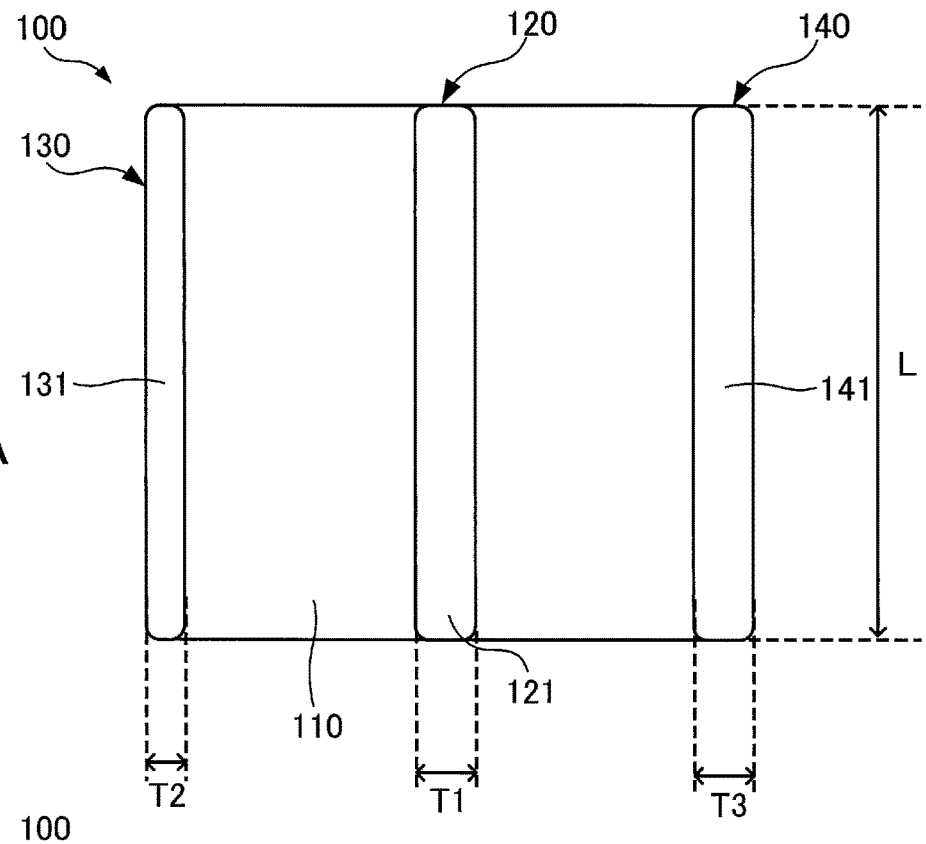
FIGS. 15A to 15C illustrate a soldering support jig used in the semiconductor device manufacturing method according to the second embodiment.
Figure 15B:
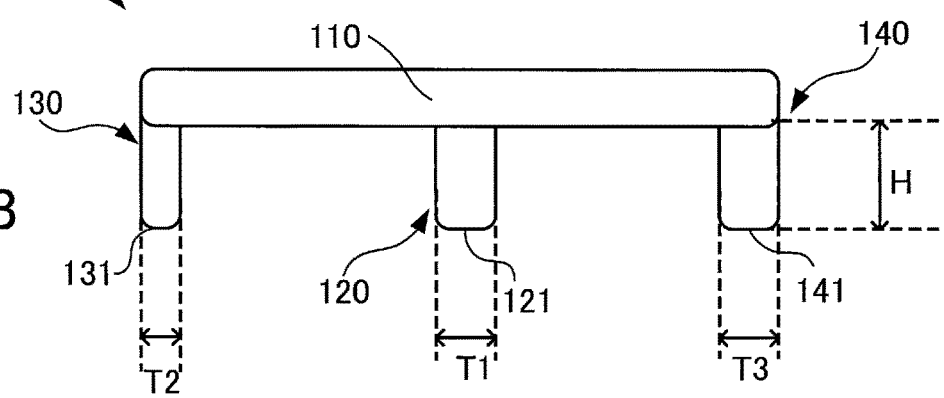
Figure 15C:
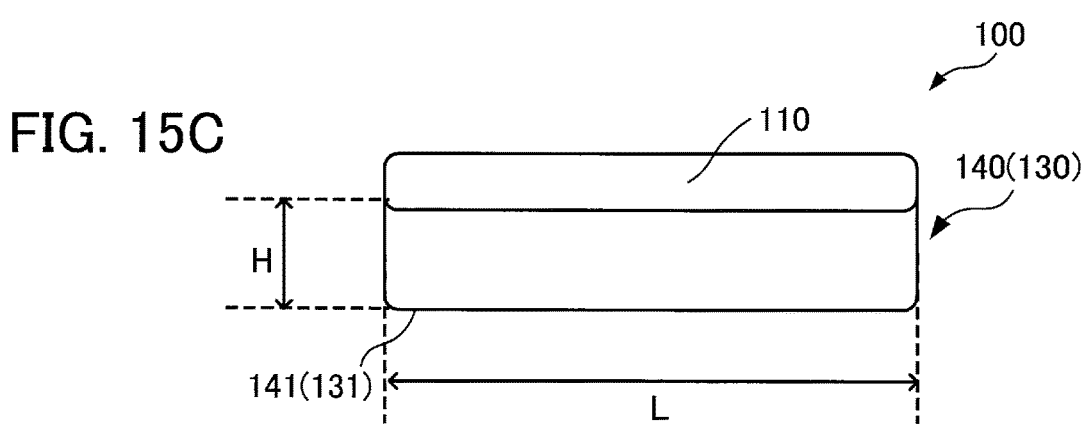

FIGS. 15A to 15C illustrate a soldering support jig 100 used in the semiconductor device manufacturing method according to the second embodiment. More specifically, FIG. 15A is a back view illustrating a back surface of the soldering support jig 100, the back surface facing the circuit patterns of the ceramic circuit board 10. FIGS. 15B and 15C are front and side views of the soldering support jig 100, respectively.

Figure 16:
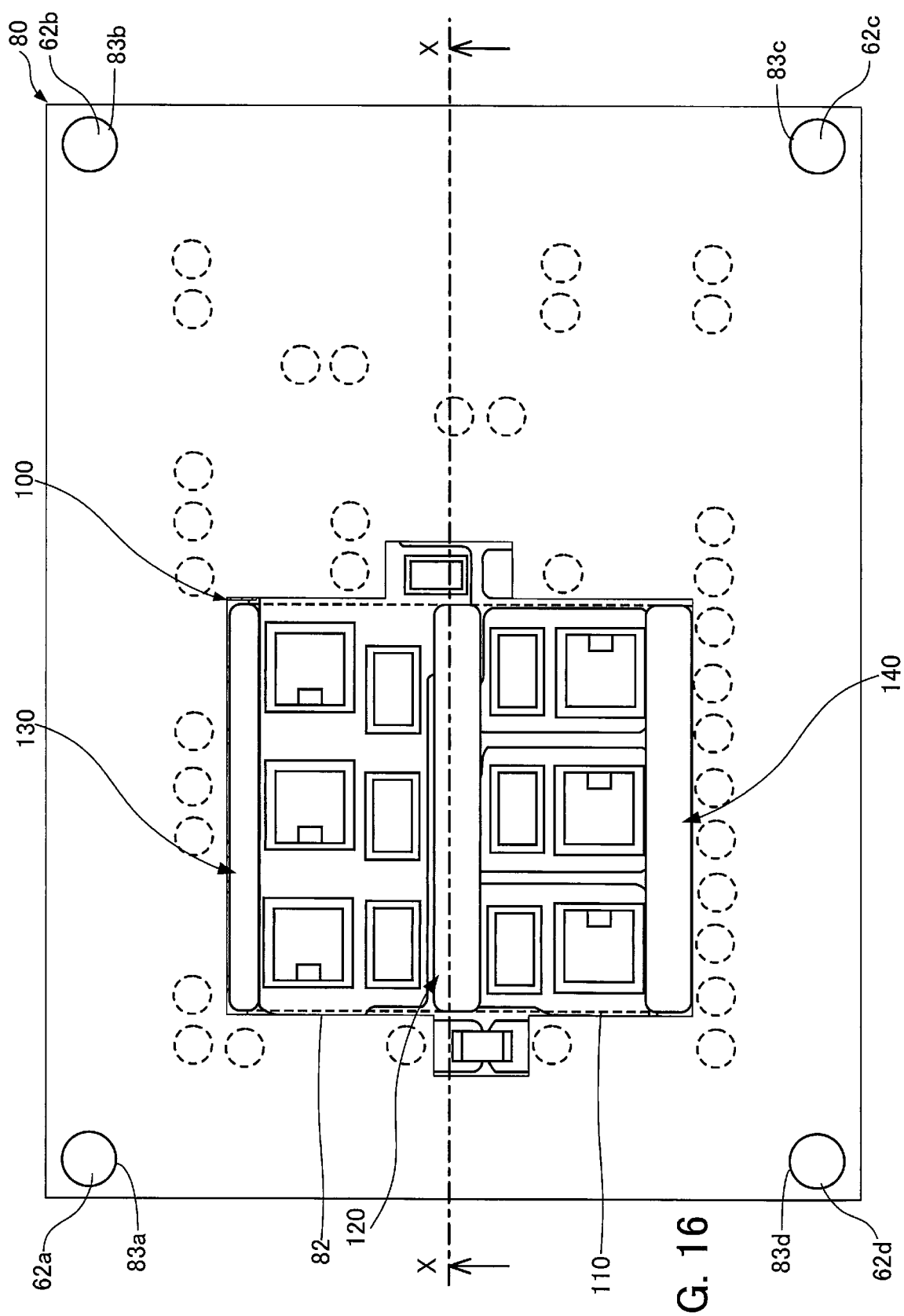
FIG. 16 is a plan view illustrating a step of covering connection areas by the soldering support jig in the semiconductor device manufacturing method according to the second embodiment.
Figure 17:
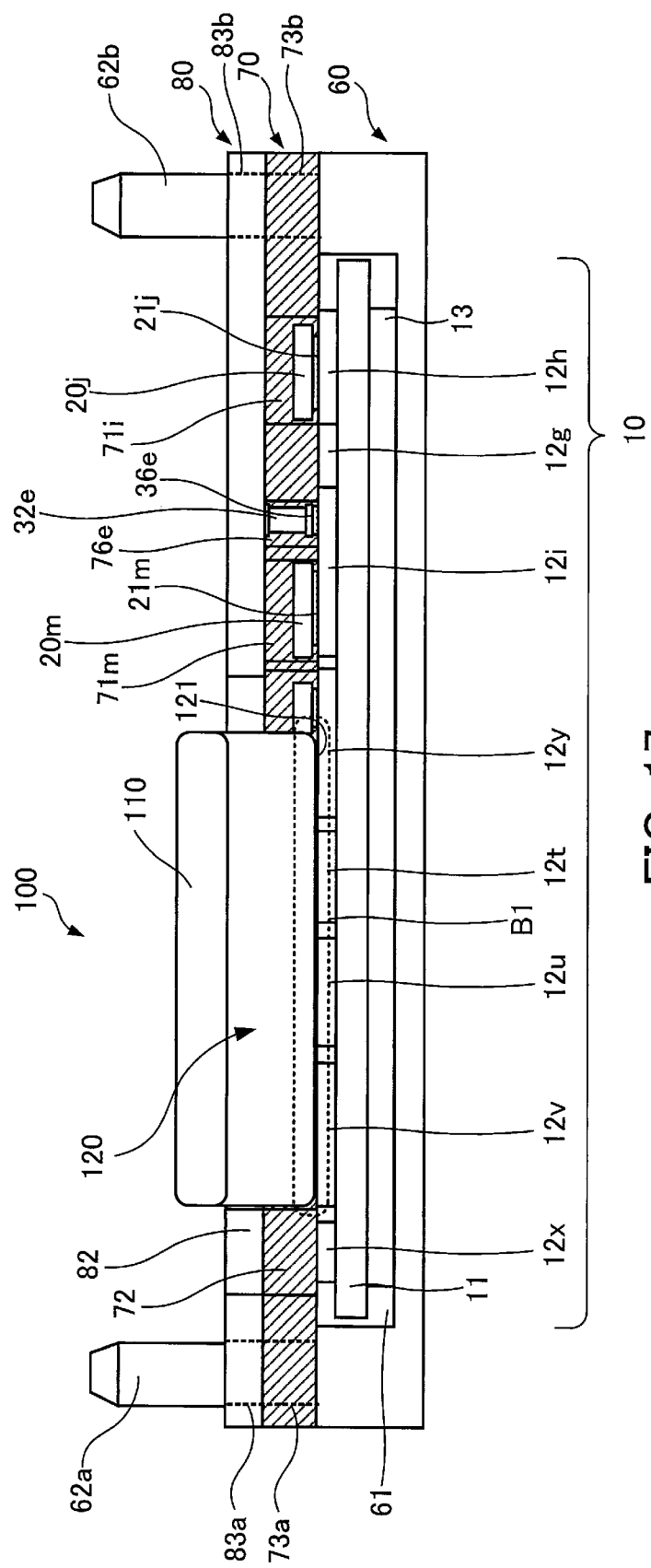
FIG. 17 is a sectional view illustrating the step of covering the connection areas by the soldering support jig in the semiconductor device manufacturing method according to the second embodiment.

FIG. 16 is a plan view illustrating a step of covering connection areas by the soldering support jig in the semiconductor device manufacturing method according to the second embodiment, and FIG. 17 is a sectional view illustrating the step of covering the connection areas by the soldering support jig in the semiconductor device manufacturing method according to the second embodiment.

[Step S11] The semiconductor elements 20a to 20t, the ceramic circuit board 10, the electronic component 20u, and the contact components 30a to 30p, 31a to 31g, 32a to 32j, 33a, and 33b are prepared.

[Step S12] As illustrated in FIGS. 6 and 7, the ceramic circuit board 10 is set in a substrate positioning jig 60.

The substrate positioning jig 60 has a rectangular shape in a plan view, and a housing part 61 is formed in the center portion thereof. The housing part 61 is formed in a concave shape so that the ceramic circuit board 10 is housed therein.

Guide pins 62a to 62d are formed in the four corners on the upper surface of the substrate positioning jig 60. The substrate positioning jig 60 is formed by a highly heat-resistive material such as a composite ceramic material or a carbon material.

The ceramic circuit board 10 is placed in the housing part 61 of the substrate positioning jig 60 with the circuit patterns 12a to 12z facing up.

Arrangement areas 12y1 to 12y6 on which the semiconductor elements 20a to 20f are to be arranged are set on the circuit pattern 12y among the plurality of circuit patterns of the ceramic circuit board 10.

Arrangement areas 12v1 and 12v2 on which the semiconductor elements 20q and 20t are to be arranged are set on the circuit pattern 12v among the plurality of circuit patterns of the ceramic circuit board 10.

Arrangement areas 12u1 and 12u2 on which the semiconductor elements 20p and 20s are to be arranged are set on the circuit pattern 12u among the plurality of circuit patterns of the ceramic circuit board 10.

Arrangement areas 12t1 and 12t2 on which the semiconductor elements 20o and 20r are to be arranged are set on the circuit pattern 12t among the plurality of circuit patterns of the ceramic circuit board 10.

Likewise, the arrangement areas of the other semiconductor elements are set on the circuit patterns other than the circuit patterns 12y, 12v, 12u, and 12t of the ceramic circuit board 10. However, reference characters for those arrangement areas are omitted.

In addition, a connection area B1 to be electrically connected to the main electrodes of the semiconductor elements 20d to 20f by bonding wires is set over the circuit patterns 12v, 12u, and 12t of the ceramic circuit board 10.

A connection area B2 to be electrically connected to the main electrodes of the semiconductor elements 20a to 20c by bonding wires is set over the circuit patterns 12z and 12a to 12e of the ceramic circuit board 10.

A connection area B3 to be electrically connected to the main electrodes of the semiconductor elements 20o to 20q by bonding wires is set over the circuit patterns 12n to 12s of the ceramic circuit board 10.

[Step S13] As illustrated in FIG. 8, solder 21a to 21t is applied to the respective arrangement areas of the semiconductor elements 20a to 20t on the circuit patterns 12y, 12f, 12h, 12g, 12i, 12k, 12t, 12u, and 12v of the ceramic circuit board 10 that has been housed in the housing part 61 of the substrate positioning jig 60.

Solder 21u is applied to the arrangement area of the electronic component 20u on the circuit patterns 12w and 12x of the ceramic circuit board 10 that has been housed in the housing part 61 of the substrate positioning jig 60.

Solder 34a to 34p is applied to the respective arrangement areas of the contact components 30a to 30p on the circuit patterns 12a, 12c, 12e, 12k, 12m, 12o, 12q, 12s, and 12y of the ceramic circuit board 10 that has been housed in the housing part 61 of the substrate positioning jig 60.

Solder 35a to 35g is applied to the respective arrangement areas of the contact components 31a to 31g on the circuit patterns 12b, 12d, 12l, 12n, 12p, 12r, and 12z of the ceramic circuit board 10 that has been housed in the housing part 61 of the substrate positioning jig 60.

Solder 36a to 36j is applied to the respective arrangement areas of the contact components 32a to 32j on the circuit patterns 12f, 12g, 12i, 12h, and 12j of the ceramic circuit board 10 that has been housed in the housing part 61 of the substrate positioning jig 60.

Solder 37a and 37b is applied to the respective arrangement areas of the contact components 33a and 33b on the circuit patterns 12x and 12w of the ceramic circuit board 10 that has been housed in the housing part 61 of the substrate positioning jig 60.

For example, screen printing may be used to apply the above solder 21a to 21t, 21u, 34a to 34p, 35a to 35g, 36a to 36j, 37a, and 37b on the circuit patterns 12a to 12z of the ceramic circuit board 10.

For example, the above solder 21a to 21t, 21u, 34a to 34p, 35a to 35g, 36a to 36j, 37a, and 37b is lead-free solder containing, as a principal component, at least one of the following alloys: an alloy of tin, silver, and copper, an alloy of tin, zinc, and bismuth, an alloy of tin and copper, and an alloy of tin, silver, indium, and bismuth. In addition to this principal component, the solder contains flux that removes oxides on the circuit patterns 12a to 12z. For example, the flux contains an epoxy resin, a carboxylic acid, a rosin resin, an activator, and a solvent. In addition, the flux may contain components other than the above components as needed. In addition, the solder 21a to 21t, 21u, 34a to 34p, 35a to 35g, 36a to 36j, 37a, and 37b may contain an additive such as nickel, germanium, cobalt, or silicon.

Hereinafter, unless the solder 21a to 21t, 21u, 34a to 34p, 35a to 35g, 36a to 36j, 37a, and 37b need to be distinguished from each other, these reference characters may be omitted.

[Step S14] As illustrated in FIGS. 9 and 10, a contact component positioning jig 70 is set on the substrate positioning jig 60.

The contact component positioning jig 70 is also formed by a highly heat-resistive material such as a composite ceramic material or a carbon material. The contact component positioning jig 70 has a rectangular plate-like shape in a plan view. Guide holes 73a to 73d are formed in the four corners of the contact component positioning jig 70. By inserting the guide pins 62a to 62d of the substrate positioning jig 60 into the guide holes 73a to 73d, respectively, the contact component positioning jig 70 is set on the substrate positioning jig 60.

Contact component positioning holes 74a to 74p, 75a to 75g, 76a to 76j, 77a, and 77b are formed in the contact component positioning jig 70. When the contact component positioning jig 70 is set as described above, these contact component positioning holes 74a to 74p, 75a to 75g, 76a to 76j, 77a, and 77b correspond to the solder applied to the respective arrangement areas of the contact components 30a to 30p, 31a to 31g, 32a to 32j, 33a, and 33b on the ceramic circuit board 10.

In addition, openings 71h, 71l, 71m, 71i, and 71n are also formed in the contact component positioning jig 70. When the contact component positioning jig 70 is set as described above, these openings 71h, 71l, 71m, 71i, and 71n correspond to the solder applied to the respective arrangement areas of the semiconductor elements 20h, 20l, 20m, 20i to 20k, and 20n on the ceramic circuit board 10. These openings 71h, 71l, 71m, 71i, and 71n have a size larger than that of the semiconductor elements 20h, 20l, 20m, 20i to 20k, and 20n.

An opening 72 is also formed in the contact component positioning jig 70. When the contact component positioning jig 70 is set as described above, this opening 72 corresponds to the semiconductor elements 20a to 20g and 20o to 20t, the electronic component 20u, and the connection areas B1 to B3 (see FIG. 6) of the ceramic circuit board 10.

[Step S15] As illustrated in FIGS. 11 and 12, the contact components 30a to 30p, 31a to 31g, 32a to 32j, 33a, and 33b are set in the contact component positioning holes 74a to 74p, 75a to 75g, 76a to 76j, 77a, and 77b of the contact component positioning jig 70, respectively, by using a mounting apparatus not illustrated.

The semiconductor elements 20h, 20l, 20m, 20i to 20k, and 20n are set in the openings 71h, 71l, 71m, 71i, and 71n of the contact component positioning jig 70, respectively, by using the mounting apparatus not illustrated.

The semiconductor elements 20a to 20g and 20o to 20t and the electronic component 20u are set in the opening 72 of the contact component positioning jig 70 by using the mounting apparatus not illustrated.

[Step S16] As illustrated in FIGS. 13 and 14, a pressing jig 80 is set on the contact component positioning jig 70.

The pressing jig 80 is also formed by a highly heat-resistive material such as a composite ceramic material or a carbon material. The pressing jig 80 has a rectangular plate-like shape in a plan view. Guide holes 83a to 83d are formed in the four corners of the pressing jig 80. By inserting the guide pins 62a to 62d of the substrate positioning jig 60 into the guide holes 83a to 83d, respectively, the pressing jig 80 is set on the contact component positioning jig 70.

An opening 82 is formed in the pressing jig 80. When the pressing jig 80 is set as described above, the opening 82 corresponds to the opening 72 of the contact component positioning jig 70.

Thus, the pressing jig 80 is arranged on the contact components 30a to 30p, 31a to 31g, 32a to 32j, 33a, and 33b set in the contact component positioning holes 74a to 74p, 75a to 75g, 76a to 76j, 77a, and 77b of the contact component positioning jig 70. In FIG. 13, the portions in the pressing jig 80 that correspond to the contact components 30a to 30p, 31a to 31g, 32a to 32j, 33a, and 33b are indicated by dashed circles.

When the pressing jig 80 is arranged, since there is space between the semiconductor elements 20h, 20l, 20m, 20i to 20k, and 20n arranged on the circuit patterns of the ceramic circuit board 10 (see FIG. 11) and the principal surface of the pressing jig 80, these semiconductor elements 20h, 20l, 20m, 20i to 20k, and 20n receive no pressing force from the pressing jig 80.

[Step S17] As illustrated in FIGS. 15A to 17, the soldering support jig 100 is set in the opening 82 of the pressing jig 80 and the opening 72 of the contact component positioning jig 70 so that the soldering support jig 100 covers the connection areas B1 to B3 of the ceramic circuit board 10.

The soldering support jig 100 includes a top plate member 110 and covering members 120, 130, and 140 that are integrally formed on a principal surface of the top plate member 110, the principal surface facing the ceramic circuit board 10. The soldering support jig 100 is also formed by a highly heat-resistive material such as a composite ceramic material or a carbon material.

The top plate member 110 has a plate-like shape that corresponds to the shape of the opening 82 of the pressing jig 80 and the opening 72 of the contact component positioning jig 70. FIG. 16 is a plan view illustrating the soldering support jig 100 that has been mounted in the opening 82 of the pressing jig 80, and the top plate member 110 is indicated by a dashed line.

As illustrated in FIGS. 15A to 15C, the covering members 120, 130, and 140 each have a columnar shape with a height H and a length L. The covering members 120, 130, and 140 have widths T1, T2, and T3, respectively. In addition, the covering members 120, 130, and 140 have covering surfaces 121, 131, and 141 on their bottom surfaces, respectively. The shapes of the covering surfaces 121, 131, and 141 correspond to those of the connection areas B1, B2, and B3 of the ceramic circuit board 10, respectively, as illustrated in FIG. 13. When the plurality of connection areas B1, B2, and B3 are formed to extend in the longitudinal direction of the ceramic circuit board 10 as illustrated in FIG. 13, the plurality of covering members 120, 130, and 140 are also formed to extend in the longitudinal direction of the ceramic circuit board 10 to correspond to the respective connection areas B1, B2, and B3, as illustrated in FIG. 16.

The soldering support jig 100 having the above structure is set in the opening 82 of the pressing jig 80 and the opening 72 of the contact component positioning jig 70. As illustrated in FIGS. 16 and 17, the soldering support jig 100 is placed in such a manner that the covering surfaces 121, 131, and 141 of the covering members 120, 130, and 140 of the soldering support jig 100 abut on the connection areas B1, B2, and B3 of the ceramic circuit board 10, respectively. Consequently, the connection areas B1, B2, and B3 of the ceramic circuit board 10 are covered by the covering surfaces 121, 131, and 141 of the covering members 120, 130, and 140 of the soldering support jig 100.

[Step S18] A reflow soldering step is performed. More specifically, after the soldering support jig 100 is set on the pressing jig 80 in step 17, the ceramic circuit board 10 is moved into a reflow furnace. Next, a heating process is performed at a reflow process temperature under reduced pressure in the reflow furnace. The reflow process temperature is in a range of 250° C. to 300° C., for example. In this step, heating and pressing the pressing jig 80 toward the ceramic circuit board 10 are simultaneously performed.

In this way, the solder 21a to 21t, 21u, 34a to 34p, 35a to 35g, 36a to 36j, 37a, and 37b melts and electrically connects the semiconductor elements 20a to 20t and the contact components 30a to 30p, 31a to 31g, 32a to 32j, 33a, and 33b to the corresponding circuit patterns.

During this reflow soldering step, small solder pieces could be scattered onto the connection area B1 on the circuit patterns 12v, 12u, and 12t from the solder 21d, 21e, and 21f on the circuit pattern 12y and the solder 21t, 21s, and 21r on the circuit patterns 12v, 12u, and 12t. However, since the connection area B1 is covered by the covering surface 121 of the covering member 120 of the soldering support jig 100, the scattered small solder pieces are prevented from being attached to the connection area B1.

Likewise, small solder pieces could be scattered onto the connection area B2 on the circuit patterns 12z, 12a, 12b, 12c, 12d, and 12e from the solder 21a, 21b, and 21C on the circuit pattern 12y. However, since the connection area B2 is covered by the covering surface 131 of the covering member 130 of the soldering support jig 100, the scattered small solder pieces are prevented from being attached to the connection area B2.

Likewise, small solder pieces could be scattered onto the connection area B3 on the circuit patterns 12m to 12s from the solder 21q, 21p, and 21o on the circuit patterns 12v, 12u, and 12t. However, since the connection area B3 is covered by the covering surface 141 of the covering member 140 of the soldering support jig 100, the scattered small solder pieces are prevented from being attached to the connection area B3.

When the melted solder 21a to 21t, 21u, 34a to 34p, 35a to 35g, 36a to 36j, 37a, and 37b is solidified, the semiconductor elements 20a to 20t, the electronic component 20u, and the contact components 30a to 30p, 31a to 31g, 32a to 32j, 33a, and 33b are bonded to the corresponding circuit patterns.

[Step S19] The substrate positioning jig 60, the contact component positioning jig 70, the pressing jig 80, and the soldering support jig 100 are removed from the ceramic circuit board 10 on which the semiconductor elements 20a to 20t, the electronic component 20u, and the contact components 30a to 30p, 31a to 31g, 32a to 32j, 33a, and 33b have been bonded to the corresponding circuit patterns.

Next, by using an ultrasonic bonding tool not illustrated, the semiconductor elements 20a to 20t are electrically connected to predetermined areas of the circuit patterns of the ceramic circuit board 10 by bonding wires.

When the reflow soldering step is performed in step S18, the connection area B1 on the circuit patterns 12v, 12u, and 12t is covered by the covering surface 121 of the covering member 120 of the soldering support jig 100. Thus, scattered small solder pieces are not attached to this connection area B1. Therefore, the main electrodes of the semiconductor elements 20d, 20e, and 20f are properly connected to the connection area B1 on the circuit patterns 12v, 12u, and 12t by bonding wires.

Likewise, the connection area B2 on the circuit patterns 12z, 12a, 12b, 12c, 12d, and 12e is covered by the covering surface 131 of the covering member 130 of the soldering support jig 100. Thus, scattered small solder pieces are not attached to this connection area B2. Therefore, the main electrodes of the semiconductor elements 20a, 20b, and 20c are properly connected to the connection area B2 on the circuit patterns 12z, 12a, 12b, 12c, 12d, and 12e by bonding wires.

Likewise, the connection area B3 on the circuit patterns 12m to 12s is covered by the covering surface 141 of the covering member 140 of the soldering support jig 100. Thus, scattered small solder pieces are not attached to this connection area B3. Therefore, the main electrodes of the semiconductor elements 20q, 20p, and 20o are properly connected to the connection area B3 on the circuit patterns 12m to 12s by bonding wires.

In addition, after the bonding wires have been connected as described above, an external connection terminal (not illustrated) is press-fitted into each of the contact components 30a to 30p, 31a to 31g, 32a to 32j, 33a, and 33b.

[Step S20] The semiconductor elements 20a to 20t, the electronic component 20u, the contact components 30a to 30p, 31a to 31g, 32a to 32j, 33a, and 33b, the bonding wires, etc. on the ceramic circuit board 10 are sealed by the sealing member 45.

As described above, the substrate positioning jig 60, the contact component positioning jig 70, and the pressing jig 80 are used in steps S12, S14, and S16, respectively. By using the above soldering support jig 100 with the soldering jigs including the substrate positioning jig 60, the contact component positioning jig 70, and the pressing jig 80, the semiconductor device 50 illustrated in FIGS. 3 and 4 is manufactured.

As described in the above method for manufacturing the semiconductor device 50, the semiconductor elements, the electronic component, the contact components, and the ceramic circuit board 10 are prepared. This ceramic circuit board 10 includes the insulating plate 11 and the circuit patterns formed on the front surface of the insulating plate 11 and having the principal surfaces on which the arrangement areas 12y1 to 12y6, 12v1, 12v2, 12u1, 12u2, 12t1, and 12t2 on which the semiconductor elements are to be arranged and the connection areas B1, B2, and B3 to which the bonding wires are to be directly connected are set.

The solder 21a to 21f, 21q, 21t, 21p, 21s, 21o, and 21r is applied to the arrangement areas 12y1 to 12y6, 12v1, 12v2, 12*u*1, 12*u*2, 12*t*1, and 12*t*2 of the ceramic circuit board 10. Next, the semiconductor elements 20*a* to 20*f*, 20*q*, 20*t*, 20*p*, 20*s*, 20*o*, and 20*r* are arranged on the arrangement areas 12*y*1 to 12*y*6, 12*v*1, 12*v*2, 12*u*1, 12*u*2, 12*t*1, and 12*t*2 via the solder 21*a* to 21*f*, 21*q*, 21*t*, 21*p*, 21*s*, 21*o*, and 21*r*.

Next, after the connection areas B1, B2, and B3 on the circuit patterns of the ceramic circuit board 10 are covered by the covering members 120, 130, and 140 of the soldering support jig 100, the solder 21*a* to 21*f*, 21*q*, 21*t*, 21*p*, 21*s*, 21*o*, and 21*r* is heated to be melted so that the semiconductor elements 20*a* to 20*f*, 20*q*, 20*t*, 20*p*, 20*s*, 20*o*, and 20*r* are fixed to the arrangement areas 12*y*1 to 12*y*6, 12*v*1, 12*v*2, 12*u*1, 12*u*2, 12*t*1, and 12*t*2 of the ceramic circuit board 10 via the solder 21*a* to 21*f*, 21*q*, 21*t*, 21*p*, 21*s*, 21*o*, and 21*r*.

When the semiconductor elements are fixed, since the connection areas B1, B2, and B3 of the ceramic circuit board 10 are covered by the covering members 120, 130, and 140 of the soldering support jig 100, small solder pieces scattered from the solder 21*a* to 21*f*, 21*q*, 21*t*, 21*p*, 21*s*, 21*o*, and 21*r* under the semiconductor elements 20*a* to 20*f*, 20*q*, 20*t*, 20*p*, 20*s*, 20*o*, and 20*r* are prevented from being attached to the connection areas B1, B2, and B3.

Thus, no small solder pieces need to be removed from the connection areas B1, B2, and B3 on the circuit patterns. In addition, the bonding wires are properly connected to the connection areas B1, B2, and B3 on the circuit patterns.

Thus, without increasing the number of manufacturing steps in the method for manufacturing the semiconductor device 50, the reliable semiconductor device 50 is manufactured.

In third to eighth embodiments, the like elements as those in the second embodiment will be denoted by the like reference characters, and detailed description thereof will be omitted as needed.

Third Embodiment

The ceramic circuit board 10 could be warped when heated during the reflow soldering step. In the third embodiment, a soldering support jig used with the ceramic circuit board 10 will be described.

First, a case in which the ceramic circuit board 10 has been warped when heated during the reflow soldering step in the second embodiment will be described with reference to FIGS. 18A and 18B.

FIGS. 18A and 18B illustrate cases in which the ceramic circuit board has been warped during the reflow soldering step in the semiconductor device manufacturing method according to the second embodiment.

More specifically, FIG. 18A illustrates a case in which the ceramic circuit board 10 has been warped in the Y direction (the longitudinal direction), and FIG. 18B illustrates a case in which the ceramic circuit board 10 has been warped in the X direction (the lateral direction).

In FIGS. 18A and 18B, the circuit patterns of the ceramic circuit board 10 and the various jigs are not illustrated.

As described in the second embodiment, after the connection areas B1 to B3 of the ceramic circuit board 10 are covered by the covering members 120, 130, and 140 of the soldering support jig 100 in step S17 in FIG. 5, the heating process is performed at the reflow process temperature in step S18 in FIG. 5.

During this process, a warp could be generated in the ceramic circuit board 10, depending on the difference in linear expansion coefficient between the metal plate 13 on the back surface and the circuit patterns on the front surface.

For example, a downward convex warp could be generated in the ceramic circuit board 10 in its longitudinal direction (the Y direction), as illustrated in FIG. 18A. Because of this warp, a gap G1 is created between the center portion of the front surface of the ceramic circuit board 10 and the covering surfaces 121, 131, and 141 of the covering members 120, 130, and 140 of the soldering support jig 100 covering the connection areas B1 to B3 of the ceramic circuit board 10.

As illustrated in FIG. 18B, a downward convex warp could be generated in the ceramic circuit board 10 in its lateral direction (the X direction). Because of this warp, a gap G2 is created between the center portion of the front surface of the ceramic circuit board 10 and the covering surface 121 of the covering member 120 of the soldering support jig 100 covering the connection area B1 of the ceramic circuit board 10.

As described in the second embodiment, the bonding wires have different diameters depending on whether the bonding wire is electrically connected to the gate electrode of a semiconductor element or to another main electrode other than the gate electrode. In the former case, the bonding wires have a diameter in a range of 110 μm to 130 μm, and the average diameter is 125 μm. In the latter case, the bonding wires have a diameter in a range of 350 μm to 450 μm, and the average diameter is 400 μm.

Thus, the circuit patterns of the ceramic circuit board 10 are divided into an area to which the bonding wires having an average diameter of 125 μm are connected and an area to which the bonding wires having an average diameter of 400 μm are connected.

If, for example, the small solder pieces scattered during the reflow soldering step have an average diameter larger than 0.045 mm, the bonding wires having the average diameter of 125 μm are not capable of being connected to their corresponding connection areas on the circuit patterns.

However, it is acceptable if the gaps G1 and G2 created between the circuit patterns to which the bonding wires having the average diameter of 125 μm are to be connected and the soldering support jig 100 are 0.045 mm or less, since only small solder pieces having an average diameter of 0.045 mm or less are able to enter those gaps G1 and G2.

In addition, if the small solder pieces scattered during the reflow soldering step have an average diameter larger than 0.17 mm, the bonding wires having the average diameter of 400 μm are not capable of being connected to their corresponding connection areas on the circuit patterns.

However, it is acceptable if the gaps G1 and G2 created between the circuit patterns to which the bonding wires having the average diameter of 400 μm are to be connected and the soldering support jig 100 are 0.17 mm or less, since only small solder pieces having an average diameter of 0.17 mm or less are able to enter those gaps G1 and G2.

However, depending on how the ceramic circuit board 10 is warped, the gaps G1 and G2 created between the circuit patterns to which the bonding wires having the average diameter of 125 μm are to be connected and the soldering support jig 100 could be larger than 0.045 mm. Likewise, the gaps G1 and G2 created between the circuit patterns to which the bonding wires having the average diameter of 400 μm are to be connected and the soldering support jig 100 could be larger than 0.17 mm.

In light of this, a soldering support jig 200 according to the third embodiment will be described with reference to FIGS. 19A to 19C.

Figure 19A:
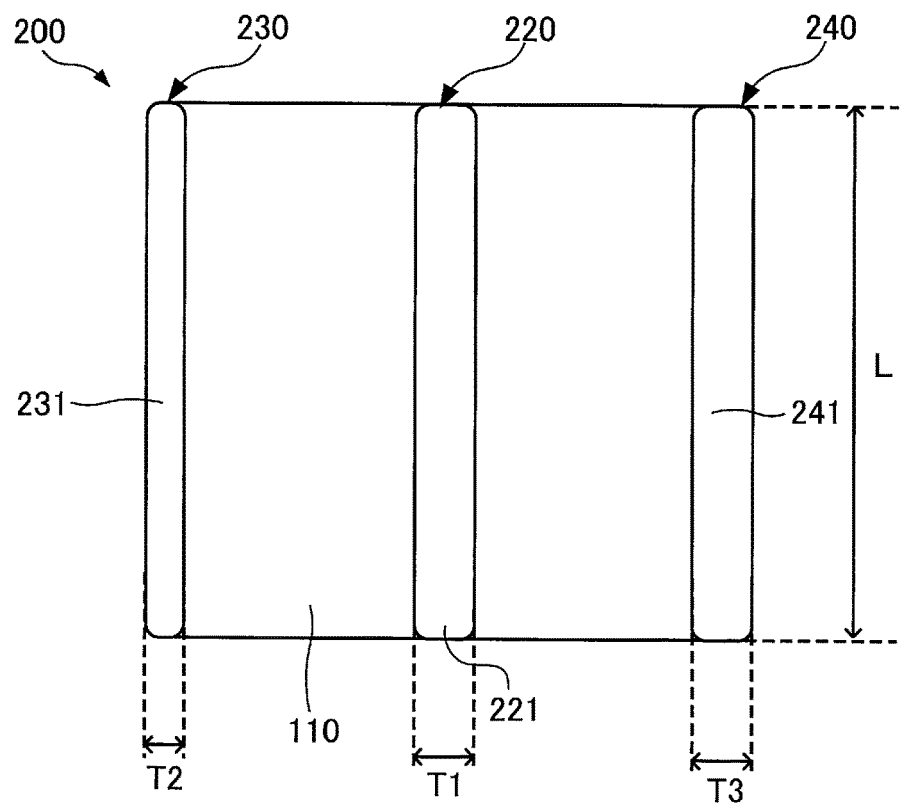
FIGS. 19A to 19C illustrate a soldering support jig used in a semiconductor device manufacturing method according to a third embodiment.
Figure 19B:
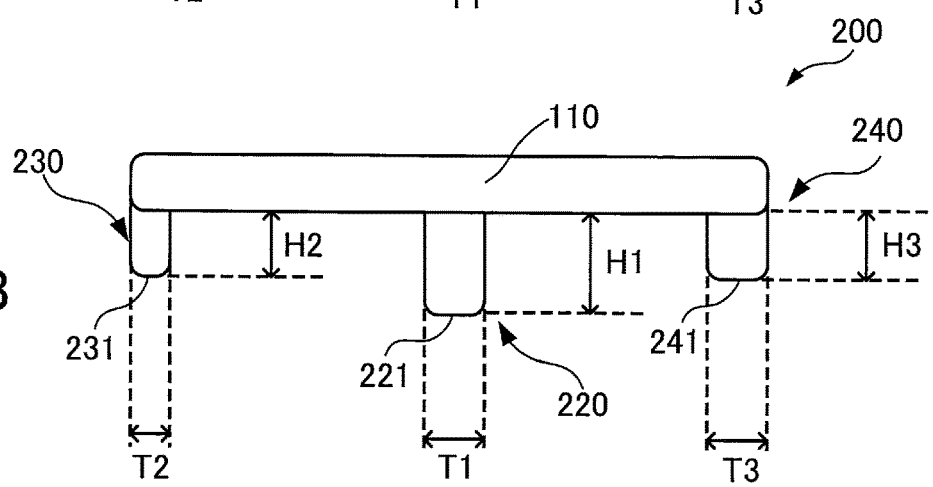
Figure 19C:
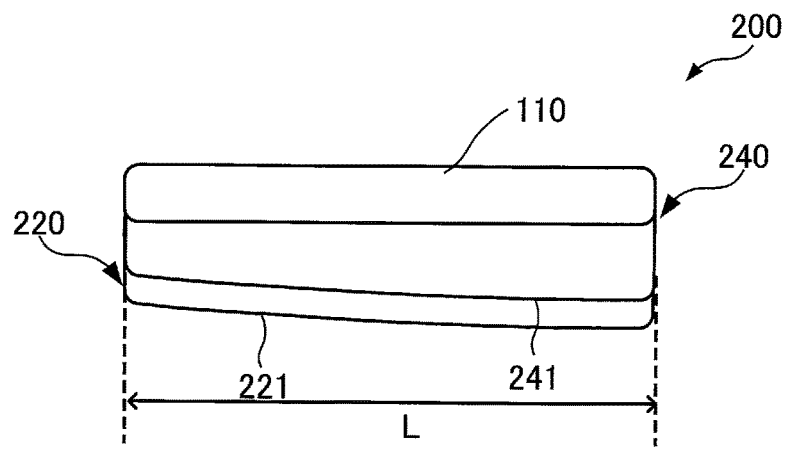

FIGS. 19A to 19C illustrate this soldering support jig 200 used in a semiconductor device manufacturing method according to the third embodiment.

More specifically, FIG. 19A is a back view illustrating a back surface of the soldering support jig 200, the back surface facing the circuit patterns of the ceramic circuit board 10. FIGS. 19B and 19C are front and side views of the soldering support jig 200, respectively.

The soldering support jig 200 includes a top plate member 110 and covering members 220, 230, and 240 that are integrally formed on the principal surface of the top plate member 110, the principal surface facing the ceramic circuit board 10. The soldering support jig 200 is also formed by a highly heat-resistive material such as a composite ceramic material or a carbon material.

As illustrated in FIGS. 19A to 19C, the covering members 220, 230, and 240 each have a columnar shape with a length L. In addition, the covering members 220, 230, and 240 have widths T1, T2, and T3, respectively. The covering members 220, 230, and 240 have curved covering surfaces 221, 231, and 241, respectively. These curved surfaces are formed by previously calculating a warp generated in the longitudinal direction (the Y direction) of the ceramic circuit board 10 when the ceramic circuit board 10 is heated. In addition, heights H1, H2, and H3 of the respective covering members 220, 230, and 240 are individually adjusted by previously calculating a warp generated in the lateral direction (the X direction) of the ceramic circuit board 10 when the ceramic circuit board 10 is heated.

Next, a case in which the soldering support jig 200 covers the connection areas B1, B2, and B3 of the ceramic circuit board 10 that has been warped during the reflow soldering step will be described with reference to FIGS. 20A and 20B.

FIGS. 20A and 20B illustrate cases in which the ceramic circuit board has been warped during the reflow soldering step in the semiconductor device manufacturing method according to the third embodiment.

FIG. 20A illustrates a case in which the ceramic circuit board 10 has been warped in the Y direction (the longitudinal direction), and FIG. 20B illustrates a case in which the ceramic circuit board 10 has been warped in the X direction (the lateral direction).

Also in FIGS. 20A and 20B, the circuit patterns of the ceramic circuit board 10 and the various jigs are not illustrated.

After the connection areas B1, B2, and B3 of the ceramic circuit board 10 are covered by the covering members 220, 230, and 240 of the soldering support jig 200 in step S17, the heating process is performed at the reflow process temperature in step S18. These steps are not illustrated in FIGS. 20A and 20B.

During this process, the ceramic circuit board 10 is warped depending on the difference in linear expansion coefficient between the metal plate 13 on its back surface and the circuit patterns on its front surface.

FIG. 20A illustrates a downward convex warp generated in the ceramic circuit board 10 in its longitudinal direction (the Y direction). In this case, a curve has previously been given to each of the covering surfaces 221, 231, and 241 of the respective covering members 220, 230, and 240 of the soldering support jig 200. In this embodiment, the curves are formed in such a manner that the heights of the covering members near the center portion of the ceramic circuit board 10 are greater than the heights of the covering members near a short side of the ceramic circuit board 10. In this way, the covering surfaces 221, 231, and 241 of the covering members 220, 230, and 240 of the soldering support jig 200 successfully cover the respective connection areas B1, B2, and B3 along the warp generated in the longitudinal direction of the ceramic circuit board 10.

FIG. 20B illustrates a downward convex warp generated in the ceramic circuit board 10 along its lateral direction (the X direction). In this case, the heights H1, H2, and H3 of the respective covering members 220, 230, and 240 of the soldering support jig 200 have previously been adjusted. In this embodiment, the height H1 of the covering member 220 near the center portion of the ceramic circuit board 10 is adjusted to be greater than the heights H2 and H3 of the respective covering members 230 and 240 near the long sides of the ceramic circuit board 10. In this way, the covering surfaces 221, 231, and 241 of the respective covering members 220, 230, and 240 of the soldering support jig 200 successfully cover the connection areas B1, B2, and B3 along the warp generated in the lateral direction of the ceramic circuit board 10.

Thus, the curve is given to each of the covering surfaces 221, 231, and 241 of the respective covering members 220, 230, and 240 of the above soldering support jig 200 to fit the warp generated in the longitudinal direction of the ceramic circuit board 10. In addition, the heights of the covering members 220, 230, and 240 of the above soldering support jig 200 are individually adjusted to fit the warp generated in the lateral direction of the ceramic circuit board 10.

In this way, even if a warp is generated in the ceramic circuit board 10 by the heating process in the reflow soldering step, the gaps created between the connection areas B1, B2, and B3 of the ceramic circuit board 10 and the covering surfaces 221, 231, and 241 of the covering members 220, 230, and 240 of the soldering support jig 200 are reduced. Thus, the small solder pieces scattered from the solder during the reflow soldering step are reliably prevented from being attached to the connection areas B1, B2, and B3 on the circuit patterns.

Fourth Embodiment

In a fourth embodiment, a variation of the soldering support jig according to the third embodiment will be described with reference to FIGS. 21A and 21B.

Figure 21A:
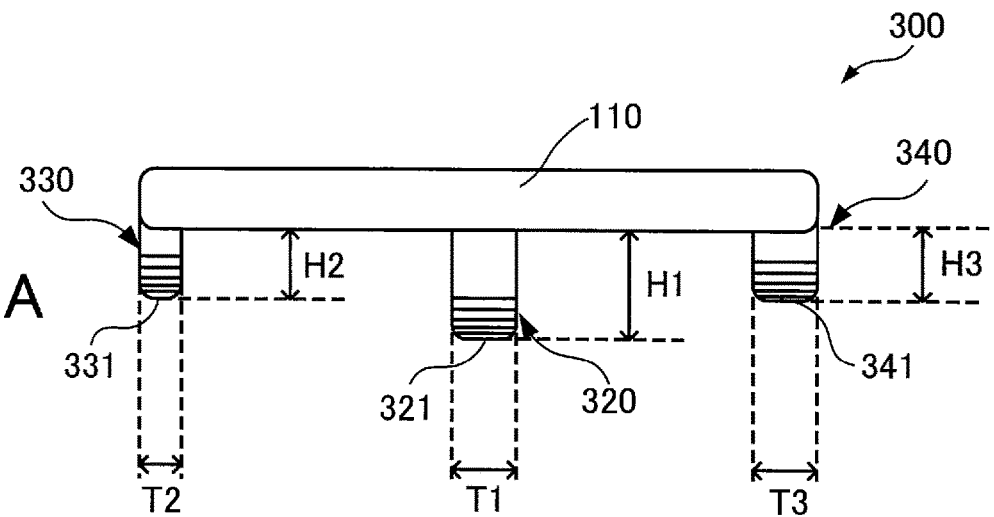
FIGS. 21A and 21B illustrate a soldering support jig used in a semiconductor device manufacturing method according to a fourth embodiment.
Figure 21B:
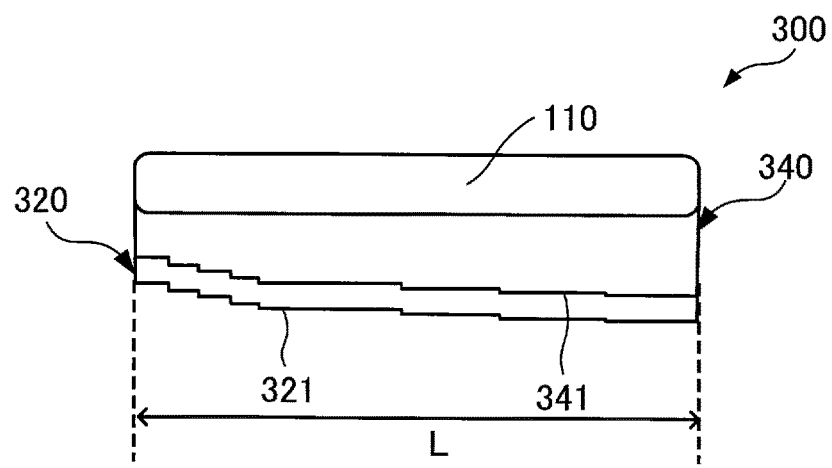

FIGS. 21A and 21B illustrate a soldering support jig 300 used in a semiconductor device manufacturing method according to the fourth embodiment.

More specifically, FIGS. 21A and 21B illustrate a front view and a side view of this soldering support jig 300, respectively. See FIG. 19A for a backside view of the soldering support jig 300.

The soldering support jig 300 includes a top plate member 110 and covering members 320, 330, and 340 that are integrally formed on the principal surface of the top plate member 110, the principal surface facing the ceramic circuit board 10. The soldering support jig 300 is also formed by a highly heat-resistive material such as a composite ceramic material or a carbon material.

As illustrated in FIGS. 21A and 21B, the covering members 320, 330, and 340 each have a columnar shape with a length L. The covering members 320, 330, and 340 have widths T1, T2, and T3, respectively. In addition, the covering members 320, 330, and 340 have covering surfaces 321, 331, and 341, and a plurality of steps are formed on each of the covering surfaces 321, 331, and 341. These steps are formed by previously calculating a warp generated in the longitudinal direction (the Y direction) of the ceramic circuit board 10 when the ceramic circuit board 10 is heated. When a downward convex warp is generated in the ceramic circuit board 10 along its longitudinal direction (the Y direction), the steps are formed in such a manner that the heights of the covering members near the center portion of the ceramic circuit board 10 are greater than the heights of the covering members near a short side of the ceramic circuit board 10. In addition, heights H1, H2, and H3 of the covering members 320, 330, and 340 are individually adjusted by previously calculating a warp generated in the lateral direction (the X direction) of the ceramic circuit board 10 by being heated. When a downward convex warp is generated in the ceramic circuit board 10 along its lateral direction (the X direction), the height H1 of the covering member 320 near the center portion of the ceramic circuit board 10 is adjusted to be greater than the heights H2 and H3 of the covering members 330 and 340 near the long sides of the ceramic circuit board 10.

In this way, as in the third embodiment, even if a warp is generated in the ceramic circuit board 10 by the heating process in the reflow soldering step, the gaps created between the connection areas B1, B2, and B3 of the ceramic circuit board 10 and the covering surfaces 321, 331, and 341 of the respective covering members 320, 330, and 340 of the soldering support jig 300 are reduced. Thus, the small solder pieces scattered from the solder during the reflow soldering step are reliably prevented from being attached to the connection areas B1, B2, and B3 on the circuit patterns.

Fifth Embodiment

In a fifth embodiment, a variation of the soldering support jig according to the second embodiment will be described with reference to FIGS. 22A to 22C.

Figure 22A:
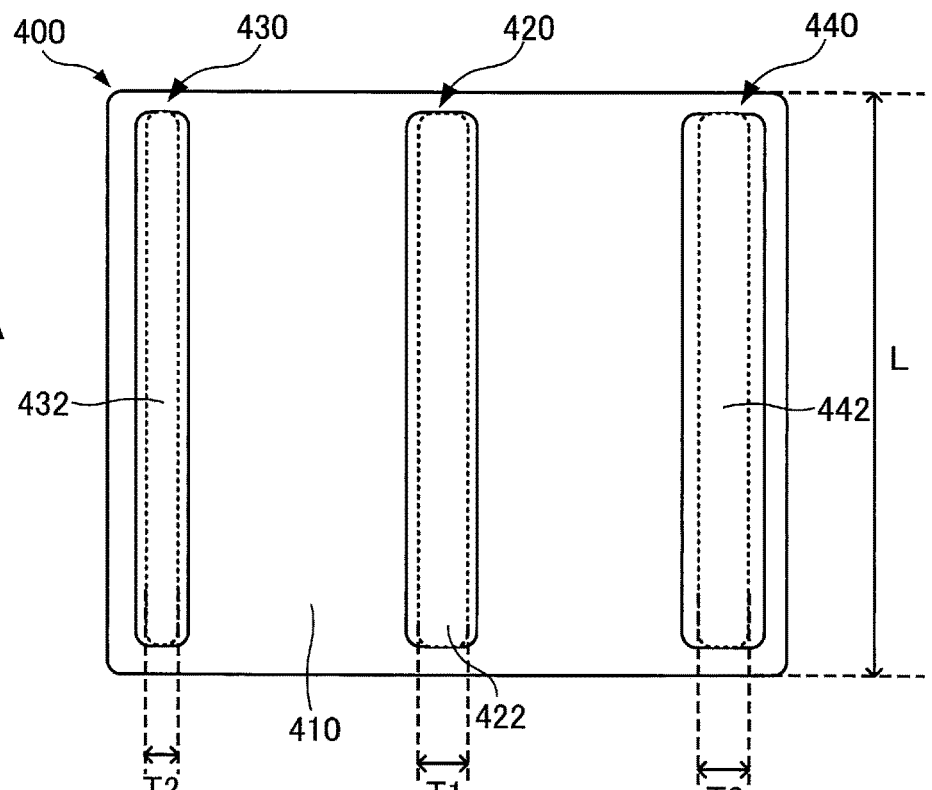
FIGS. 22A to 22C illustrate a soldering support jig used in a semiconductor device manufacturing method according to a fifth embodiment.
Figure 22B:
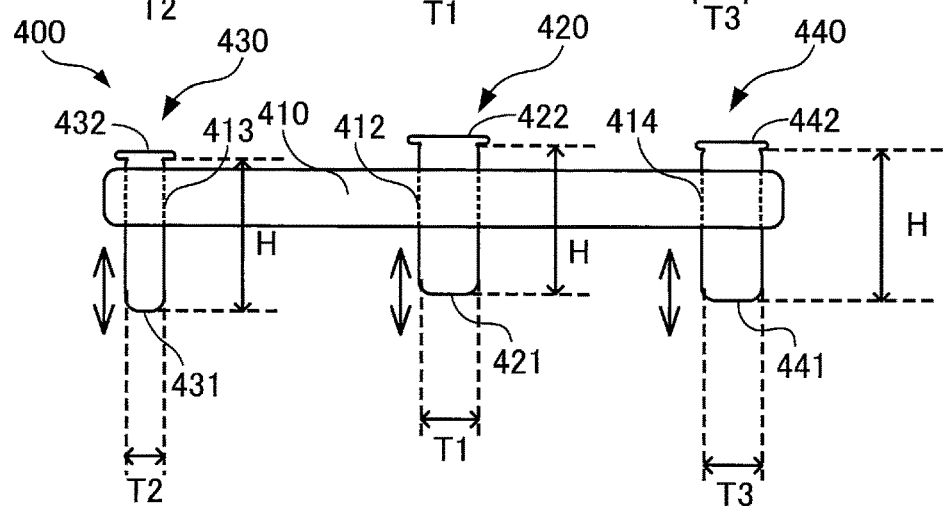
Figure 22C:
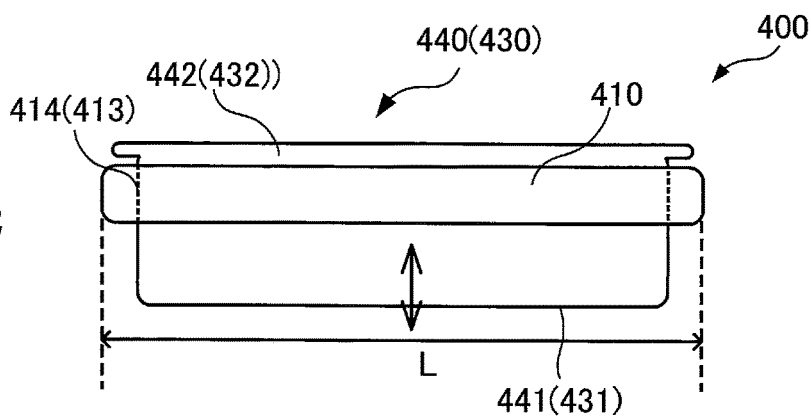

FIGS. 22A to 22C illustrate a soldering support jig 400 used in a semiconductor device manufacturing method according to the fifth embodiment.

More specifically, FIG. 22A illustrates a front surface of the soldering support jig 400, the front surface being opposite to the surface facing the circuit patterns of the ceramic circuit board 10. FIGS. 22B and 22C are front and side views of the soldering support jig 400, respectively.

The soldering support jig 400 includes a top plate member 410 and covering members 420, 430, and 440 that are integrally formed on the front surface of the top plate member 410, the front surface being opposite to the surface facing the ceramic circuit board 10. The soldering support jig 400 is also formed by a highly heat-resistive material such as a composite ceramic material or a carbon material.

The top plate member 410 has a plate-like shape that corresponds to the opening 82 of the pressing jig 80 and the opening 72 of the contact component positioning jig 70. For example, in a plan view, the top plate member 410 has a shape as indicated by a dashed line in the opening 82 in FIG. 16. In addition, openings 412, 413, and 414 are formed in positions of the top plate member 410, which correspond to the connection areas B1, B2, and B3 of the ceramic circuit board 10, respectively, when the soldering support jig 400 is set in the opening 82 of the pressing jig 80 and the opening 72 of the contact component positioning jig 70.

As illustrated in FIGS. 22A to 22C, the covering members 420, 430, and 440 each have a columnar shape with a height H and a length L. The covering members 420, 430, and 440 have widths T1, T2, and T3, respectively. In addition, the covering members 420, 430, and 440 have covering surfaces 421, 431, and 441 on their respective bottom surfaces. The shapes of the covering surfaces 421, 431, and 441 correspond to those of the connection areas B1, B2, and B3 (see FIG. 13) of the ceramic circuit board 10, respectively. In addition, one end of each of these covering members 420, 430, and 440 is inserted into a corresponding one of the openings 412, 413, and 414 in the top plate member 410, and locking parts 422, 432, and 442 are formed on the other ends of the respective covering members 420, 430, and 440. In this way, the covering members 420, 430, and 440 are vertically movable in the respective openings 412, 413, and 414 in the top plate member 410. However, downward movement of the covering members 420, 430, and 440 beyond the top plate member 410 is restricted, since the covering members 420, 430, and 440 are locked by the locking parts 422, 432, and 442 at the top plate member 410.

The soldering support jig 400 having the above structure is set in the opening 82 of the pressing jig 80 and the opening 72 of the contact component positioning jig 70. The soldering support jig 400 is placed in such a manner that the covering surfaces 421, 431, and 441 of the covering members 420, 430, and 440 of the soldering support jig 400 abut on the connection areas B1, B2, and B3 of the ceramic circuit board 10, respectively. Thus, the connection areas B1, B2, and B3 of the ceramic circuit board 10 have been covered by the covering surfaces 421, 431, and 441 of the covering members 420, 430, and 440 of the soldering support jig 400.

In this way, as in the third embodiment, even if a warp is generated in the ceramic circuit board 10 by the heating process in the reflow soldering step, the gaps created between the connection areas B1, B2, and B3 of the ceramic circuit board 10 and the covering surfaces 421, 431, and 441 of the respective covering members 420, 430, and 440 of the soldering support jig 400 are reduced. Thus, the small solder pieces scattered from the solder during the reflow soldering step are reliably prevented from being attached to the connection areas B1, B2, and B3 on the circuit patterns.

Sixth Embodiment

In a sixth embodiment, a variation of the soldering support jig according to the fifth embodiment will be described with reference to FIGS. 23A and 23C.

Figure 23A:
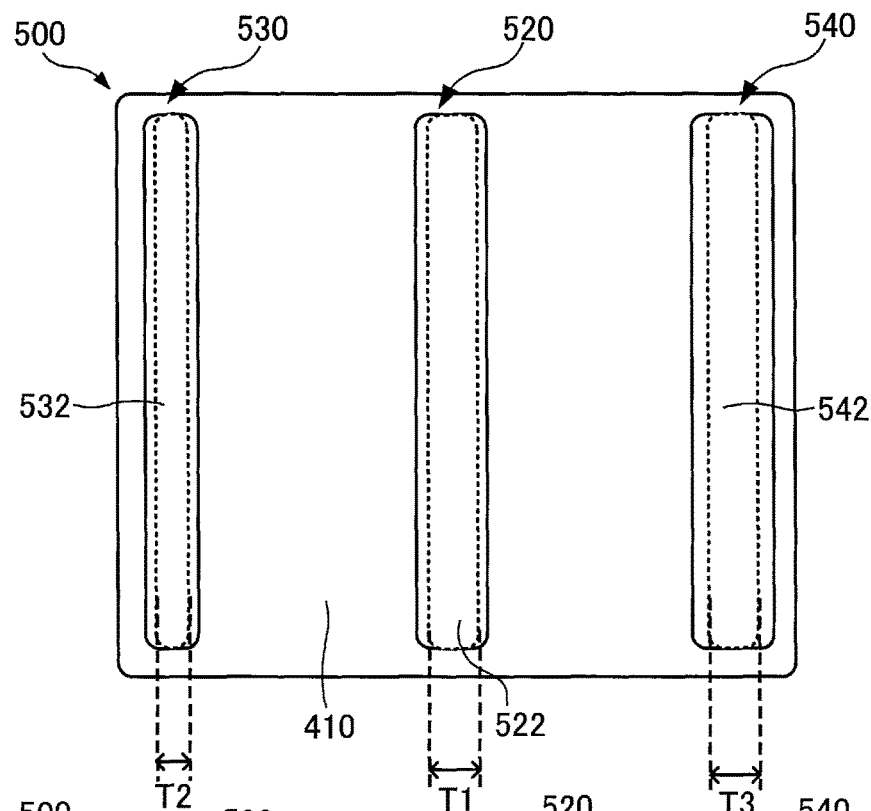
FIGS. 23A to 23C illustrate a soldering support jig used in a semiconductor device manufacturing method according to a sixth embodiment.
Figure 23B:
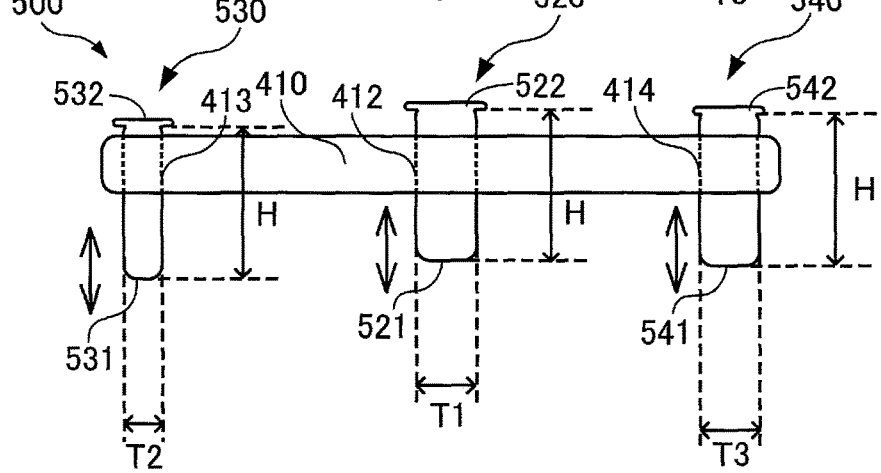
Figure 23C:
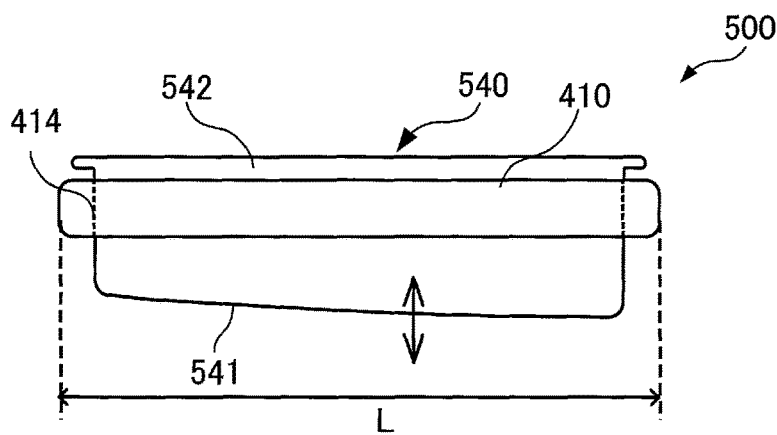

FIGS. 23A and 23C illustrate a soldering support jig used in a semiconductor device manufacturing method according to the sixth embodiment.

More specifically, FIG. 23A illustrates a front surface of the soldering support jig 500, the front surface being opposite to the surface facing the ceramic circuit board 10. FIGS. 23B and 23C are front and side views of the soldering support jig 500, respectively.

The soldering support jig 500 includes a top plate member 410 and covering members 520, 530, and 540 that are integrally formed on the front surface of the top plate member 410. The soldering support jig 500 is also formed by a highly heat-resistive material such as a composite ceramic material or a carbon material.

As illustrated in FIGS. 23A to 23C, the covering members 520, 530, and 540 each have a columnar shape having a height H and a length L. The covering members 520, 530, and 540 have widths T1, T2, and T3, respectively. In addition, the covering members 520, 530, and 540 have covering surfaces 521, 531, and 541 on their bottom surfaces, respectively. As in the third embodiment as illustrated in FIGS. 19A to 19C, a curve is given to each of the covering surfaces 521, 531, and 541 of the covering members 520, 530, and 540. These curved surfaces are formed by previously calculating a warp generated in the longitudinal direction (the Y direction) of the ceramic circuit board 10 when the ceramic circuit board 10 is heated. In this embodiment, the curves are formed in such a manner that the heights of the covering members near the center portion of the ceramic circuit board 10 are greater than the heights of the covering members near a short side of the ceramic circuit board 10.

The shapes of the covering surfaces 521, 531, and 541 correspond to those of the connection areas B1, B2, and B3 (see FIG. 13) of the ceramic circuit board 10, respectively. In addition, one end of each of these covering members 520, 530, and 540 is inserted into a corresponding one of the openings 412, 413, and 414 in the top plate member 410, and locking parts 522, 532, and 542 are formed on the other ends of the respective covering members 520, 530, and 540. In this way, the covering members 520, 530, and 540 are vertically movable in the respective openings 412, 413, and 414 in the top plate member 410. However, downward movement of the covering members 520, 530, and 540 beyond the top plate member 410 is restricted, since the covering members 520, 530, and 540 are locked by the locking parts 522, 532, and 542 at the top plate member 410.

Next, a step of covering the connection areas B1, B2, and B3 of the ceramic circuit board 10 that has been warped during the reflow soldering step by the soldering support jig 500 will be described with reference to FIGS. 24A and 24B.

Figure 24A:
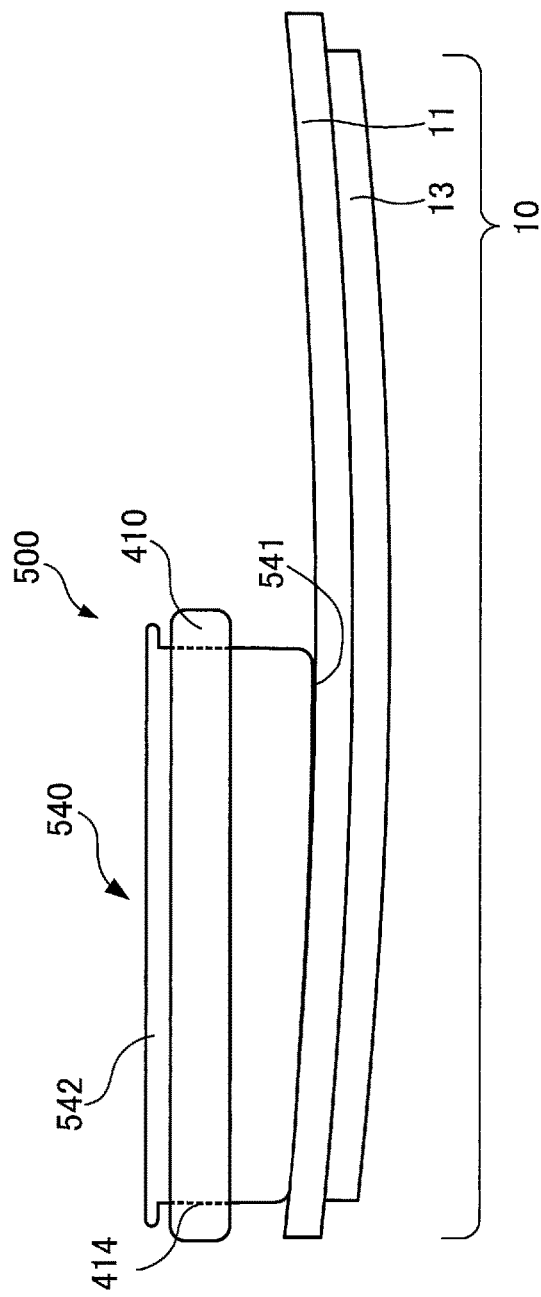
FIGS. 24A and 24B illustrate cases in which a ceramic circuit board has been warped by a reflow soldering step in the semiconductor device manufacturing method according to the sixth embodiment.
Figure 24B:
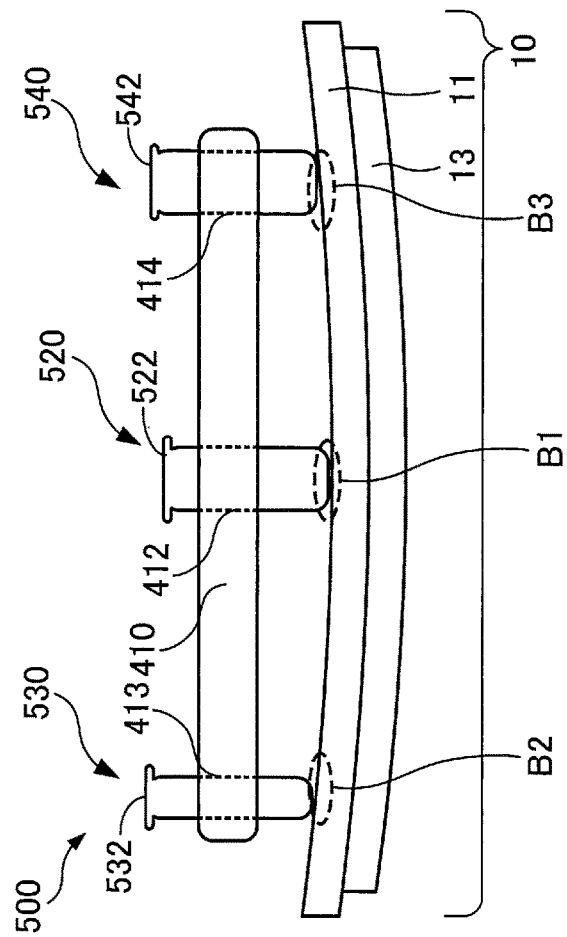

FIGS. 24A and 24B illustrate cases in which the ceramic circuit board has been warped during the reflow soldering step in the semiconductor device manufacturing method according to the sixth embodiment.

More specifically, FIG. 24A illustrates a case in which the ceramic circuit board 10 has been warped in the Y direction (the longitudinal direction), and FIG. 24B illustrates a case in which the ceramic circuit board 10 has been warped in the X direction (the lateral direction).

Also in FIGS. 24A and 24B, the circuit patterns of the ceramic circuit board 10 and the various jigs are not illustrated.

After the connection areas B1, B2, and B3 of the ceramic circuit board 10 are covered by the covering members 520, 530, and 540 of the soldering support jig 500 in step S17, the heating process is performed at the reflow process temperature in step S18. These steps are not illustrated in FIGS. 24A and 24B.

During this process, the ceramic circuit board 10 is warped depending on the difference in linear expansion coefficient between the metal plate 13 on its back surface and the circuit patterns on its front surface.

FIG. 24A illustrates a downward convex warp generated in the ceramic circuit board 10 along its longitudinal direction (the Y direction). In this case, a curve has previously been given to each of the covering surfaces 521, 531, and 541 of the respective covering members 520, 530, and 540 of the soldering support jig 500. Thus, the covering surfaces 521, 531, and 541 of the respective covering members 520, 530, and 540 of the soldering support jig 500 successfully cover the connection areas B1, B2, and B3 along the warp generated in the longitudinal direction of the ceramic circuit board 10.

In addition, FIG. 24B illustrates a downward convex warp generated in the ceramic circuit board 10 along its lateral direction (the X direction). In this case, the covering members 520, 530, and 540 of the soldering support jig 500 are inserted in the respective openings 412, 413, and 414 in the top plate member 410 in such a manner that the covering members 520, 530, and 540 are vertically movable therein. Therefore, since the covering members 520, 530, and 540 of the soldering support jig 500 are movable upward to fit the warp generated in the lateral direction of the ceramic circuit board 10, the covering members 520, 530, and 540 successfully cover the connection areas B1, B2, and B3.

Thus, the curve is given to each of the covering surfaces 521, 531, and 541 of the respective covering members 520, 530, and 540 of the above soldering support jig 500 to fit the warp generated in the longitudinal direction of the ceramic circuit board 10. In addition, the heights of the covering members 520, 530, and 540 of the above soldering support jig 500 are individually adjusted to fit the warp generated in the lateral direction of the ceramic circuit board 10.

In this way, even if a warp is generated in the ceramic circuit board 10 by the heating process in the reflow soldering step, the gaps created between the connection areas B1, B2, and B3 of the ceramic circuit board 10 and the covering surfaces 521, 531, and 541 of the respective covering members 520, 530, and 540 of the soldering support jig 500 are reduced. Thus, the small solder pieces scattered from the solder during the reflow soldering step are reliably prevented from being attached to the connection areas B1, B2, and B3 on the circuit patterns.

Alternatively, in place of the curves, a plurality of steps that fit the warp in the ceramic circuit board 10 may be formed on the covering surfaces 521, 531, and 541 of the covering members 520, 530, and 540 of the soldering support jig 500, as in FIGS. 21A and 21B in the fourth embodiment.

Seventh Embodiment

In a seventh embodiment, a case in which covering members of a soldering support jig are mounted on a pressing jig will be described as an example.

A pressing jig according to the seventh embodiment will be described with reference to FIGS. 25, 26A, and 26B.

Figure 25:
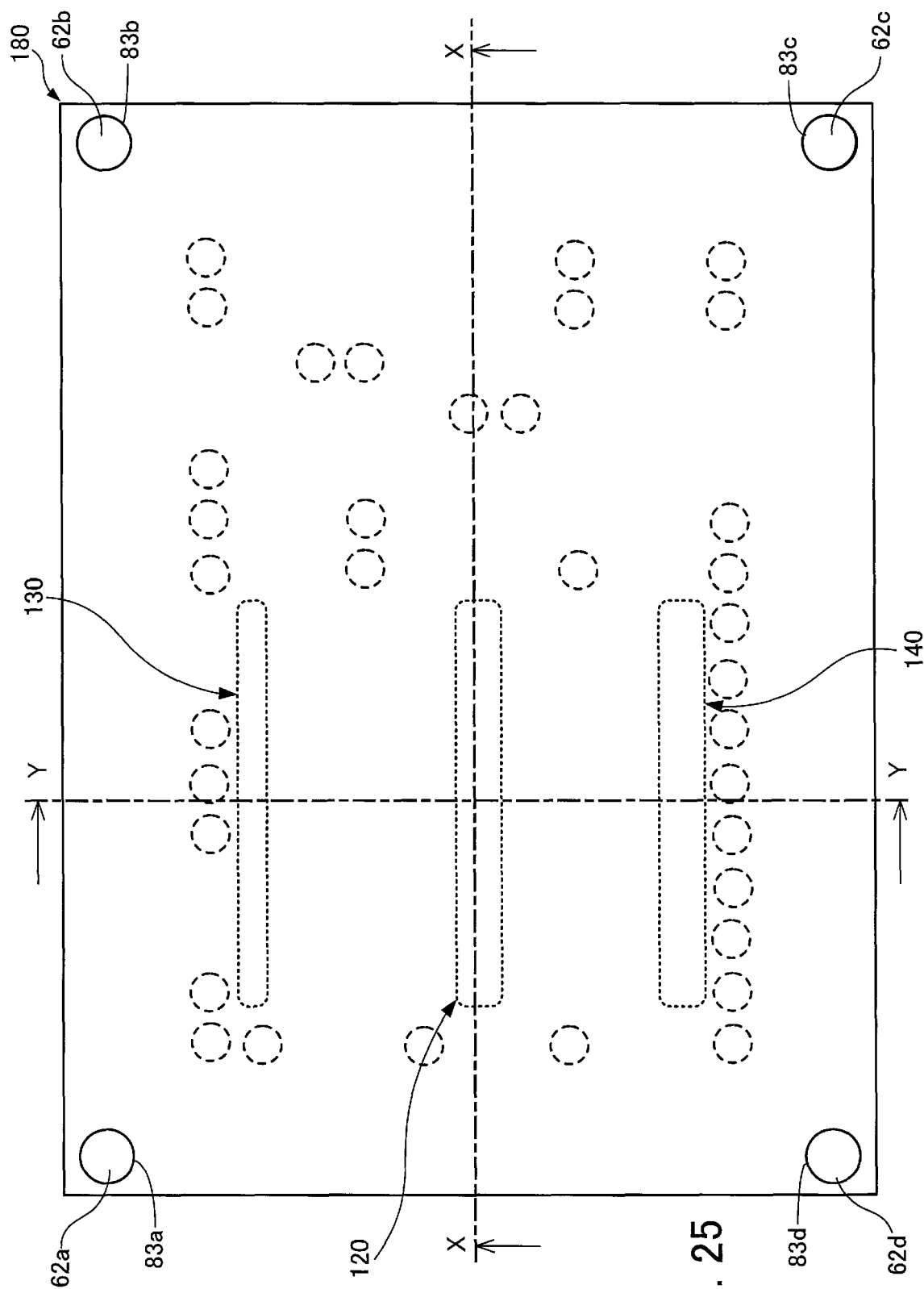
FIG. 25 is a plan view of a pressing jig used in a semiconductor device manufacturing method according to a seventh embodiment.

FIG. 25 is a plan view of the pressing jig used in a semiconductor device manufacturing method according to the seventh embodiment, and FIGS. 26A and 26B are sectional views of the pressing jig used in the semiconductor device manufacturing method according to the seventh embodiment.

FIG. 26A is a sectional view taken along an alternate long and short dash line Y-Y in FIG. 25. FIG. 26B is a sectional view taken along an alternate long and short dash line X-X in FIG. 25.

The pressing jig 180 is formed by a highly heat-resistive material such as a composite ceramic material or a carbon material. The pressing jig 180 has a rectangular plate-like shape in a plan view. Guide holes 83a to 83d are formed in the four corners of the pressing jig 180. By inserting the guide pins 62a to 62d of the substrate positioning jig 60 into the guide holes 83a to 83d, respectively, the pressing jig 180 is set on the contact component positioning jig 70.

In addition, covering members 120, 130, and 140 are formed on positions of the pressing jig 180, the positions corresponding to the connection areas B1, B2, and B3 of the ceramic circuit board 10 when the pressing jig 180 is set on the contact component positioning jig 70 as described above.

As in FIGS. 15A to 15C in the second embodiment, the covering members 120, 130, and 140 each have a columnar shape having a height H and a length L. The covering members 120, 130, and 140 have widths T1, T2, and T3, respectively. In addition, the covering members 120, 130, and 140 have covering surfaces 121, 131, and 141 on their bottom surfaces, respectively. The shapes of the covering surfaces 121, 131, and 141 correspond to those of the connection areas B1, B2, and B3 (see FIG. 13) of the ceramic circuit board 10, respectively.

Next, a step of setting a pressing member, namely, step S16 in the method for manufacturing the semiconductor device 50 illustrated in FIG. 5, in which the above pressing jig 180 is used will be described with reference to FIG. 27.

Figure 27:
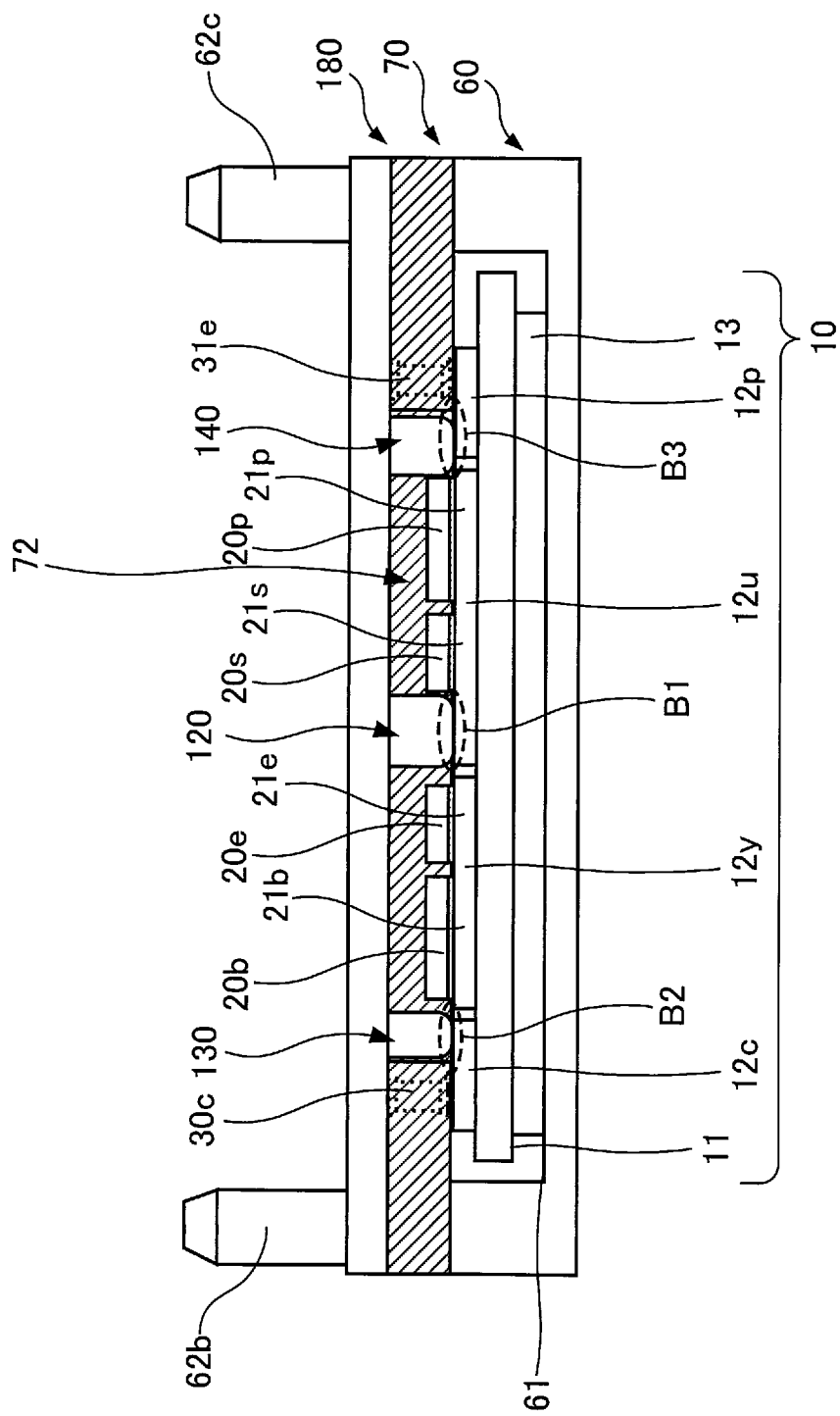
FIG. 27 is a sectional view illustrating a step of setting the pressing jig in the semiconductor device manufacturing method according to the seventh embodiment.

FIG. 27 is a sectional view illustrating a step of setting the pressing jig in a semiconductor device manufacturing method according to the seventh embodiment. More specifically, FIG. 27 is a sectional view taken along an alternate long and short dash line Y-Y in FIG. 25 and illustrates a state in which the pressing jig 180 has been set on the contact component positioning jig 70 in the manufacturing process of the semiconductor device 50.

In step S15 in the method for manufacturing the semiconductor device 50 according to the second embodiment, the contact components 30a to 30p, 31a to 31g, 32a to 32j, 33a, and 33b, the semiconductor elements 20a to 20t, and the electronic component 20u are set on the circuit patterns of the ceramic circuit board 10 by using the contact component positioning jig 70, as illustrated in FIGS. 11 and 12.

Next, in step S16, by inserting the guide pins 62a to 62d of the substrate positioning jig 60 into the guide holes 83a to 83d of the pressing jig 180, respectively, the pressing jig 180 is set on the contact component positioning jig 70.

Thus, the pressing jig 180 is arranged on the contact components 30a to 30p, 31a to 31g, 32a to 32j, 33a, and 33b set in the respective contact component positioning holes 74a to 74p, 75a to 75g, 76a to 76j, 77a, and 77b of the contact component positioning jig 70.

In addition, as illustrated in FIG. 27, passing through the opening 72 of the contact component positioning jig 70, the covering surfaces 121, 131, and 141, whose reference characters are not illustrated in FIG. 27, of the covering members 120, 130, and 140 of the pressing jig 180 cover the connection areas B1, B2, and B3 on the circuit patterns of the ceramic circuit board 10, respectively.

Next, by performing subsequent steps S18 to S20 in the method for manufacturing the semiconductor device 50 according to the second embodiment, the semiconductor device 50 is manufactured.

As described above, the covering members 120, 130, and 140 are mounted on the pressing jig 180. Thus, by setting the pressing jig 180 on the contact component positioning jig 70, the pressing jig 180 is arranged on the contact components 30a to 30p, 31a to 31g, 32a to 32j, 33a, and 33b set in the respective contact component positioning holes 74a to 74p, 75a to 75g, 76a to 76j, 77a, and 77b of the contact component positioning jig 70. In addition, the connection areas B1, B2, and B3 on the circuit patterns of the ceramic circuit board 10 are covered by the covering members 120, 130, and 140 of the pressing jig 180, respectively. In this way, the semiconductor device 50 is manufactured by performing steps S18 to S20 without performing step S17. Namely, the step of setting the soldering support jig 100 in the method for manufacturing the semiconductor device 50 according to the second embodiment does not need to be performed.

With the covering members 120, 130, and 140 of the pressing jig 180, the same advantageous effects as those provided by using the soldering support jig 100 according to the second embodiment are obtained.

In addition, if there is a possibility that a warp is generated in the ceramic circuit board 10 during the reflow soldering step, each of the covering surfaces 121, 131, and 141 of the respective covering members 120, 130, and 140 of the pressing jig 180 may be formed to have a curve or a plurality of steps and a height that fit the warp, as in the third or fourth embodiment illustrated in FIGS. 19A to 19C and FIGS. 21A and 21B.

Eighth Embodiment

In an eighth embodiment, a case in which the covering members of the soldering support jig according to the fifth embodiment are mounted on a pressing jig will be described as an example.

A pressing jig according to the eighth embodiment will be described with reference to FIGS. 28, 29A, and 29B.

Figure 28:
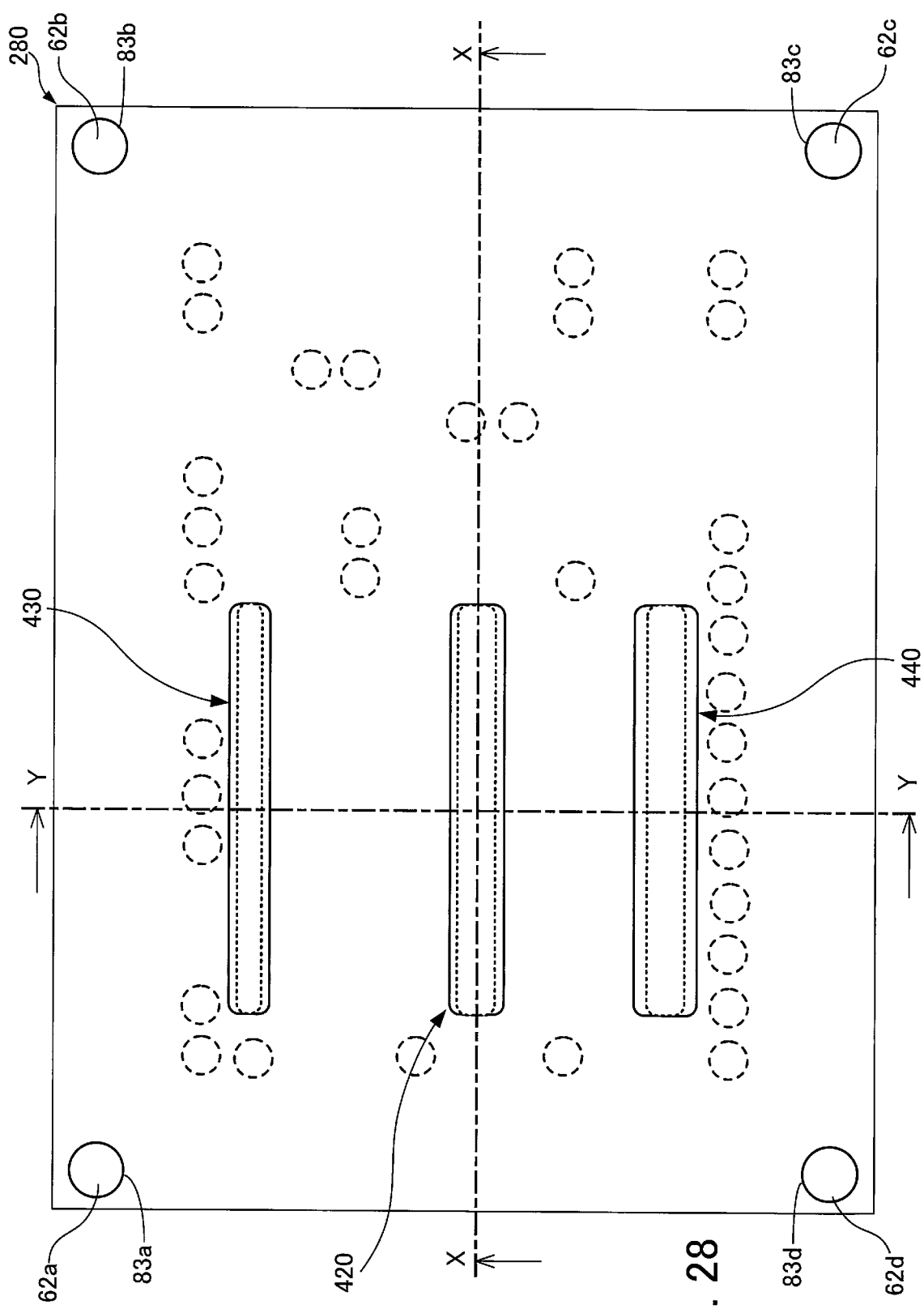
FIG. 28 is a plan view of a pressing jig used in a semiconductor device manufacturing method according to an eighth embodiment.
Figure 30:
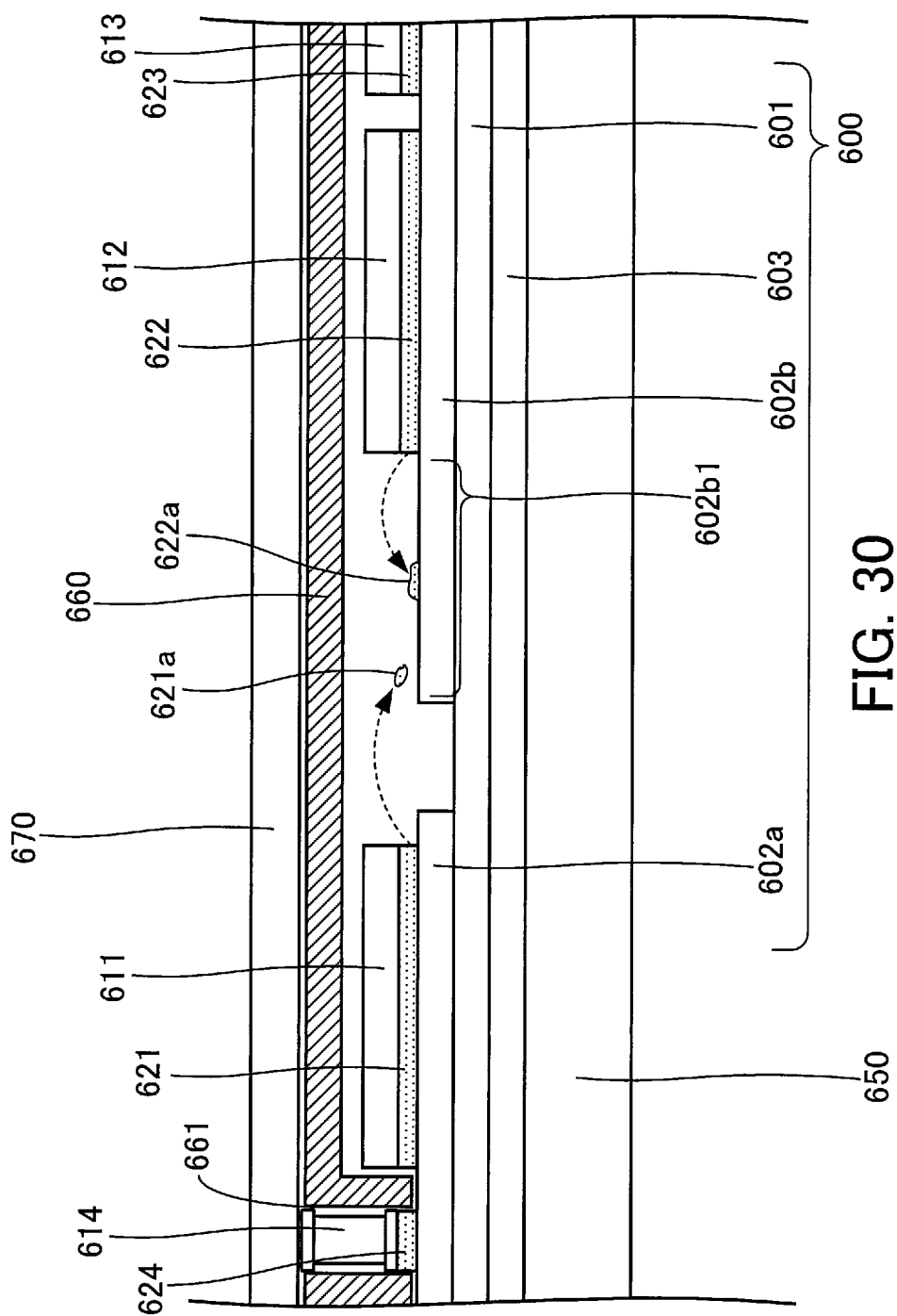
FIG. 30 illustrates a soldering process in a semiconductor device manufacturing method.

FIG. 28 is a plan view of the pressing jig used in a semiconductor device manufacturing method according to the eighth embodiment, and FIGS. 29A and 29B are sectional views of the pressing jig 280 used in the semiconductor device manufacturing method according to the eighth embodiment.

FIG. 29A is a sectional view taken along an alternate long and short dash line Y-Y in FIG. 28. FIG. 29B is a sectional view taken along an alternate long and short dash line X-X in FIG. 28.

The pressing jig 280 is formed by a highly heat-resistive material such as a composite ceramic material or a carbon material. The pressing jig 280 has a rectangular plate-like shape in a plan view. Guide holes 83a to 83d are formed in the four corners of the pressing jig 280. By inserting the guide pins 62a to 62d of the substrate positioning jig 60 into the guide holes 83a to 83d, respectively, the pressing jig 280 is set on the contact component positioning jig 70.

In addition, the openings 412, 413, and 414 are formed in positions of the pressing jig 280, the positions corresponding to the connection areas B1, B2, and B3 of the ceramic circuit board 10 when the pressing jig 280 is set on the contact component positioning jig 70 as described above. The covering members 420, 430, and 440 are inserted into the openings 412, 413, and 414 of the pressing jig 280, respectively.

As in FIGS. 22A to 22C in the fifth embodiment, the covering members 420, 430, and 440 each have a columnar shape having a height H and a length L. The covering members 420, 430, and 440 have widths T1, T2, and T3, respectively. In addition, the covering members 420, 430, and 440 have covering surfaces 421, 431, and 441 on their bottom surfaces, respectively. The shapes of the covering surfaces 421, 431, and 441 correspond to those of the connection areas B1, B2, and B3 (see FIG. 13) of the ceramic circuit board 10, respectively. In addition, one end of each of these covering members 420, 430, and 440 is inserted into a corresponding one of the openings 412, 413, and 414, and locking parts 422, 432, and 442 are formed on the other ends of the respective covering members 420, 430, and 440. Thus, the covering members 420, 430, and 440 are vertically movable in the respective openings 412, 413, and 414 in the pressing jig 280. However, downward movement of the covering members 420, 430, and 440 beyond the pressing jig 280 is restricted, since the covering members 420, 430, and 440 are locked by the locking parts 422, 432, and 442 at the pressing jig 280.

Next, a step of setting a pressing member, namely, step S16 in the method for manufacturing the semiconductor device 50 illustrated in FIG. 5, in which the above pressing jig 280 is used will be described.

In step S15 in the method for manufacturing the semiconductor device 50 according to the second embodiment, the contact components 30a to 30p, 31a to 31g, 32a to 32j, 33a, and 33b, the semiconductor elements 20a to 20t, and the electronic component 20u are set on the circuit patterns of the ceramic circuit board 10 by using the contact component positioning jig 70, as illustrated in FIGS. 11 and 12.

Next, in step S16, as in the seventh embodiment, by inserting the guide pins 62a to 62d of the substrate positioning jig 60 into the guide holes 83a to 83d of the pressing jig 280, respectively, the pressing jig 280 is set on the contact component positioning jig 70.

Thus, the pressing jig 280 is arranged on the contact components 30a to 30p, 31a to 31g, 32a to 32j, 33a, and 33b set in the respective contact component positioning holes 74a to 74p, 75a to 75g, 76a to 76j, 77a, and 77b of the contact component positioning jig 70.

In addition, passing through the opening 72 of the contact component positioning jig 70, the covering surfaces 421, 431, and 441 of the covering members 420, 430, and 440 of the pressing jig 280 cover the connection areas B1, B2, and B3 on the circuit patterns of the ceramic circuit board 10, respectively.

Next, by performing subsequent steps S18 to S20 in the method for manufacturing the semiconductor device 50 according to the second embodiment, the semiconductor device 50 is manufactured.

In this way, by using the above pressing jig 280, as in the seventh embodiment, the semiconductor device 50 is manufactured by performing steps S18 to S20 without performing step S17. Namely, the step of setting the soldering support jig 100 in the method for manufacturing the semiconductor device 50 according to the second embodiment does not need to be performed.

With the covering members 420, 430, and 440 of the pressing jig 280, the same advantageous effects as those provided by using the soldering support jig 100 according to the second embodiment are obtained.

In addition, if there is a possibility that a warp is generated in the ceramic circuit board 10 during the reflow soldering step, each of the covering surfaces 421, 431, and 441 of the respective covering members 420, 430, and 440 of the pressing jig 280 may be formed to have a curve or a plurality of steps that fits the warp, as in the third, fourth, or sixth embodiment illustrated in FIGS. 19A to 19C, FIGS. 21A and 21B, and FIGS. 23A to 23C.

According to the technique discussed herein, small solder pieces scattered during a reflow soldering step are prevented from being attached to connection areas where wiring members are connected. Consequently, since the wiring members are properly bonded to the connection areas, a reliable semiconductor device is manufactured.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A soldering support jig comprising:
a columnar covering member having a covering surface at a bottom of the columnar covering member, wherein
the soldering support jig is used for a substrate, the substrate having an arrangement area on which a component is to be arranged and a connection area to which a wiring member is to be directly connected, the connection area neighboring the arrangement area, and
the covering surface of the soldering support jig is formed to correspond to the connection area.

2. The soldering support jig according to claim 1, further comprising a curve formed on the covering surface of the covering member to fit a warp of the substrate in a direction parallel to a long side of the substrate, the warp being generated when heating is performed to solder the component to the arrangement area.

3. The soldering support jig according to claim 1, further comprising:
a plurality of steps formed on the covering surface of the covering member to fit a warp of the substrate in a direction parallel to a long side of the substrate, the warp being generated when heating is performed to solder the component to the arrangement area.

4. The soldering support jig according to claim 1, wherein
the soldering support jig is used for the substrate when the connection area includes a plurality of connection areas aligned in a direction parallel to a long side of the substrate, and
the covering member includes a plurality of covering members to respectively correspond to the plurality of connection areas.

5. The soldering support jig according to claim 4, wherein heights of the covering members are individually adjusted to fit a warp in a direction parallel to a short side of the substrate, the warp being generated when heating is performed to solder the component to the arrangement area.

6. The soldering support jig according to claim 4, further comprising:
a top plate member having openings, the openings being formed to correspond to the respective neighboring connection areas,
wherein the respective covering members are inserted in such a manner that the covering members are vertically movable to the substrate.

7. The soldering support jig according to claim 1, wherein the component is a semiconductor element.

* * * * *